(12) United States Patent
Seo et al.

(10) Patent No.: US 12,396,307 B2
(45) Date of Patent: Aug. 19, 2025

(54) DISPLAY DEVICE

(71) Applicant: Samsung Display Co., LTD., Yongin-si (KR)

(72) Inventors: Ki Seong Seo, Yongin-si (KR); Soo Chul Kim, Yongin-si (KR); Dae Ho Song, Yongin-si (KR); So Yeon Yoon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 689 days.

(21) Appl. No.: 17/691,350

(22) Filed: Mar. 10, 2022

(65) Prior Publication Data

US 2022/0352132 A1  Nov. 3, 2022

(30) Foreign Application Priority Data

Apr. 30, 2021 (KR) .................. 10-2021-0056824

(51) Int. Cl.
*H10H 20/857* (2025.01)
*H01L 25/16* (2023.01)
(Continued)

(52) U.S. Cl.
CPC ......... *H10H 20/857* (2025.01); *H01L 25/167* (2013.01); *H10D 86/021* (2025.01); *H10H 20/856* (2025.01); *H10K 59/878* (2023.02); *H10K 59/8792* (2023.02); *H10K 59/8731* (2023.02); *H10K 59/879* (2023.02)

(58) Field of Classification Search
CPC . H01L 25/167; H01L 25/0753; H10D 86/021; H10D 30/0295; H10D 10/821; H10D 30/6215; H10D 84/858; H10H 20/856; H10H 20/8142; A61K 40/405; H10K 59/8792; H10K 59/879; H10K 59/878; H10K 59/8731; H10K 50/125; H10K 59/122; H10K 59/126; H10K 59/38; G02B 5/201
See application file for complete search history.

(56) References Cited

U.S. PATENT DOCUMENTS 9,111,464 B2  8/2015  Bibl et al.
9,178,123 B2  11/2015  Sakariya et al.
(Continued)

FOREIGN PATENT DOCUMENTS

KR  10-0999696  12/2010
KR  10-1704334  2/2017
(Continued)

*Primary Examiner* — Jeff W Natalini
*Assistant Examiner* — Rose Keagy
(74) *Attorney, Agent, or Firm* — CANTOR COLBURN LLP

(57) ABSTRACT

A display device includes a first electrode is disposed on a substrate, a pixel defining layer disposed on the substrate in a non-emission area and defining an emission area, a reflection pattern protrudes upward from the first electrode in the emission area and forming a concave part on the first electrode, a light emitting element disposed in the concave part and electrically connected to the first electrode, and a second electrode disposed on the light emitting element and electrically connected to the light emitting element. The reflection pattern does not overlap the pixel defining layer in a plan view.

16 Claims, 25 Drawing Sheets

(51) Int. Cl.
    *H10D 86/01*     (2025.01)
    *H10H 20/856*     (2025.01)
    *H10K 59/80*     (2023.01)

(56) References Cited

U.S. PATENT DOCUMENTS

| | | | |
|---|---|---|---|
| 2017/0023839 A1* | 1/2017 | Han | H10D 86/443 |
| 2017/0083155 A1* | 3/2017 | Yang | G09G 3/3266 |
| 2018/0190672 A1 | 7/2018 | Lee et al. | |
| 2019/0393387 A1* | 12/2019 | Kwon | H10H 29/10 |
| 2020/0194505 A1* | 6/2020 | Tang | H10K 59/80521 |
| 2021/0012078 A1* | 1/2021 | Chang | G06F 3/04166 |
| 2021/0265322 A1* | 8/2021 | Jeon | H10H 20/857 |

FOREIGN PATENT DOCUMENTS

| | | |
|---|---|---|
| KR | 10-1837362 | 4/2018 |
| KR | 10-2021-0025216 | 3/2021 |

* cited by examiner

170: 170a, 170b

DISPLAY DEVICE

CROSS-REFERENCE TO RELATED APPLICATION(S)

The present application claims priority to and the benefit of Korean Patent Application 10-2021-0056824 under 35 U.S.C. § 119, filed on Apr. 30, 2021, in the Korean Intellectual Property Office (KIPO), the entire contents of which are incorporated herein by reference.

BACKGROUND

1. Technical Field

The disclosure generally relates to a display device.

2. Related Art

Recently, as interest in information displays is increased, research and development of display devices have been continuously conducted.

SUMMARY

Embodiments provide a display device capable of displaying an image with a more accurate luminance.

Embodiments also provide a display device capable of improving light emission efficiency.

In accordance with an aspect of the disclosure, there is provided a display device including a first electrode disposed on a substrate; a pixel defining layer disposed on the substrate in a non-emission area, the pixel defining layer defining an emission area; a reflection pattern protruding upward from the first electrode in the emission area and forming a concave part on the first electrode; a light emitting element disposed in the concave part and electrically connected to the first electrode; and a second electrode disposed on the light emitting element and electrically connected to the light emitting element. The reflection pattern does not overlap the pixel defining layer in a plan view.

The reflection pattern may be spaced apart from the pixel defining layer.

The reflection pattern may include a metal which reflects light emitted from the light emitting element.

The display device may further include an insulating layer disposed between the reflection pattern and the second electrode. A side surface of the reflection pattern, which corresponds to the concave part, may be spaced apart from the light emitting element. The insulating layer may be disposed in a space between the side surface of the reflection pattern and the light emitting element and a space between the reflection pattern and the pixel defining layer.

The light emitting element may include a second semiconductor layer electrically connected to the first electrode; a first semiconductor layer electrically connected to the second electrode; and an active layer disposed between the second semiconductor layer and the first semiconductor layer. With respect to the first electrode, a height of a top surface of the reflection pattern may be greater than a height of the active layer.

A thickness of the reflection pattern may be smaller than a thickness of the light emitting element.

With respect to the substrate, an inclined angle of a side surface of the reflection pattern, which corresponds to the concave part, may be different from an inclined angle of a side surface of the pixel defining layer.

The concave part may be defined by the reflection pattern on a plane, and have a circular, quadrangular, or polygonal planar shape.

A portion of the concave part may be defined by the pixel defining layer on a plane.

The first electrode may include a material having an electrical conductivity higher than an electrical conductivity of the reflection pattern.

The reflection pattern may include an opening exposing the first electrode. The concave part may be defined by the opening of the reflection pattern and the first electrode.

The reflection pattern may include a first part completely overlapping the first electrode on a plane, and a second part protruding upward from the first part. The light emitting element may be disposed on the first part of the reflection pattern.

The reflection pattern may be integral with the first electrode.

The display device may further include a light conversion pattern located on the light emitting element and corresponding to the emission area; and a light blocking pattern located on the pixel defining layer and corresponding to the non-emission area.

The light conversion pattern may include a color conversion layer converting light of a first color, which is emitted from the light emitting element, into light of a second color; and a color filter located on the color conversion layer, the color filter allowing the light of the second color to be selectively transmitted therethrough.

The display device may further include a sensor electrode disposed on the second electrode in the non-emission area; a first refractive layer overlapping the sensor electrode, the first refractive layer including an opening corresponding to the emission area; and a second refractive layer disposed on the first refractive layer and disposed in the opening of the first refractive layer.

In accordance with another aspect of the disclosure, there is provided a display device including a first electrode disposed on a substrate; a reflection pattern protruding upward from the first electrode and forming a concave part on the first electrode; a pixel defining layer disposed on the first electrode and the reflection pattern in a non-emission area, the pixel defining layer defining an emission area; a light emitting element disposed in the concave part and electrically connected to the first electrode; and a second electrode disposed on the light emitting element and electrically connected to the light emitting element.

The display device may further include an insulating layer disposed between the reflection pattern and the second electrode. A side surface of the reflection pattern, which corresponds to the concave part, may be spaced apart from the light emitting element. The insulating layer may be disposed in a space between the side surface of the reflection pattern and the light emitting element and a space between the reflection pattern and the pixel defining layer.

The light emitting element may include a second semiconductor layer electrically connected to the first electrode; a first semiconductor layer electrically connected to the second electrode; and an active layer disposed between the second semiconductor layer and the first semiconductor layer. With respect to the first electrode, a height of a top surface of the reflection pattern may be greater than a height of the active layer. A thickness of the reflection pattern may be smaller than a thickness of the light emitting element.

In accordance with still another aspect of the disclosure, there is provided a display device including a first electrode disposed on a substrate, the first electrode including a concave part recessed toward the substrate in an emission area; a pixel defining layer disposed on the substrate and the first electrode in a non-emission area, the pixel defining layer defining the emission area; a light emitting element disposed in the concave part and electrically connected to the first electrode; and a second electrode disposed on the light emitting element and electrically connected to the light emitting element.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

Figure 1:
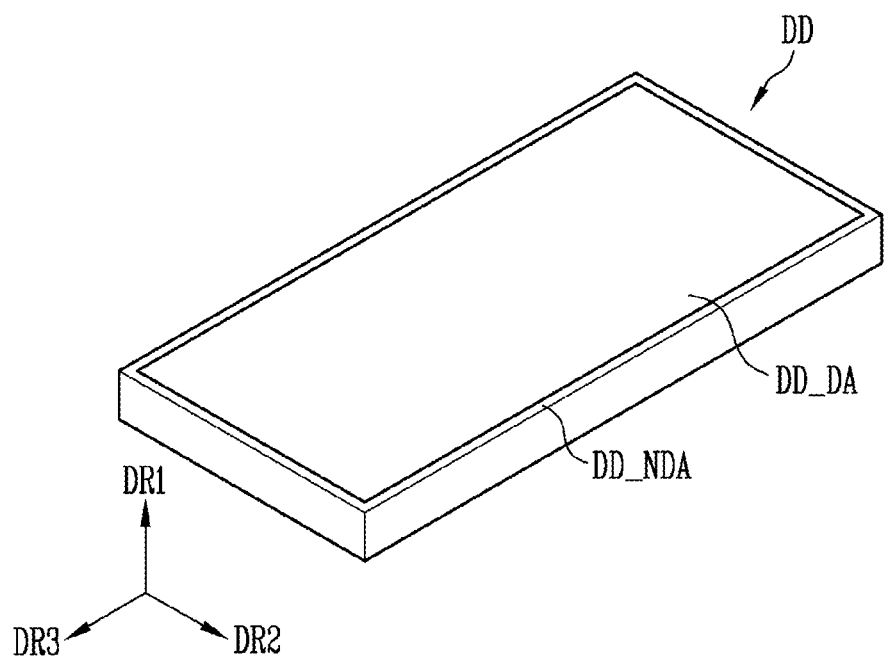
FIG. 1 is a perspective view schematically illustrating a display device in accordance with embodiments of the disclosure.

The disclosure may apply various changes and different shape, therefore only illustrate in detail with particular examples. However, the examples do not limit to certain shapes but apply to all the change and equivalent material and replacement. The drawings included are illustrated in a fashion where the figures are expanded for the better understanding.

In the drawings, the thickness of certain lines, layers, components, elements or features may be exaggerated for clarity. It will be understood that, although the terms "first," "second," and the like may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

In this specification, it will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

Hereinafter, embodiments of the disclosure and items required for those skilled in the art to easily understand the content of the disclosure will be described in detail with reference to the accompanying drawings. In the following description, singular forms in the disclosure are intended to include the plural meanings as well, unless the context clearly indicates otherwise.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
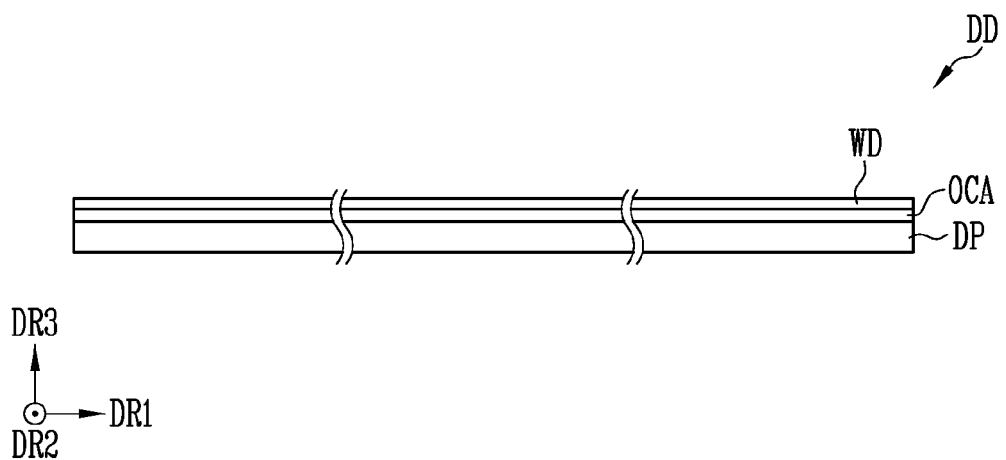
FIG. 2 is a cross-sectional view schematically illustrating the display device shown in FIG. 1.
Figure 3:
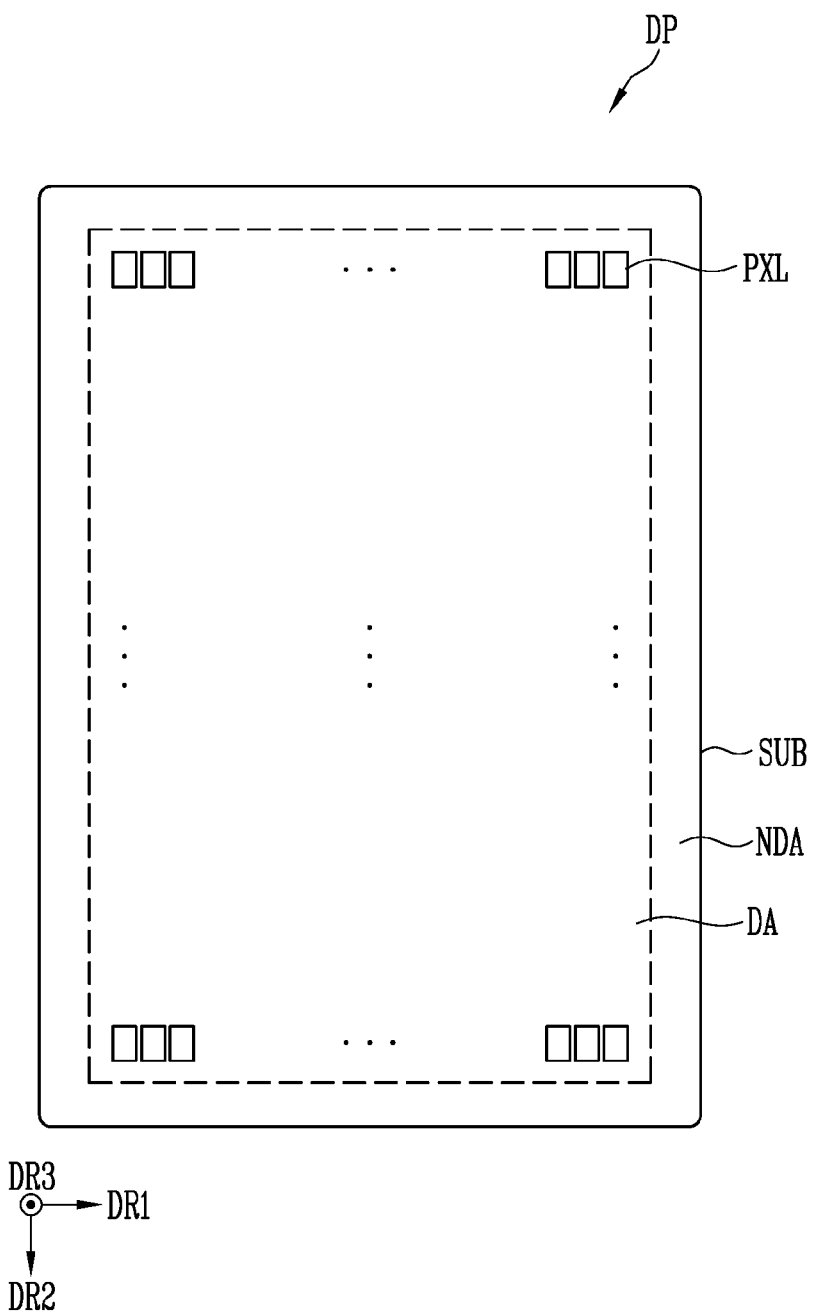
FIG. 3 is a plan view schematically illustrating a display panel included in the display device shown in FIG. 2.
Figure 4A:
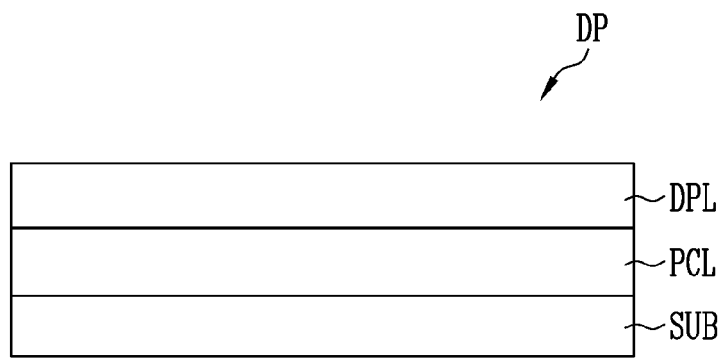
FIGS. 4A, 4B, and 4C are cross-sectional views schematically illustrating the display panel shown in FIG. 3.
Figure 4B:
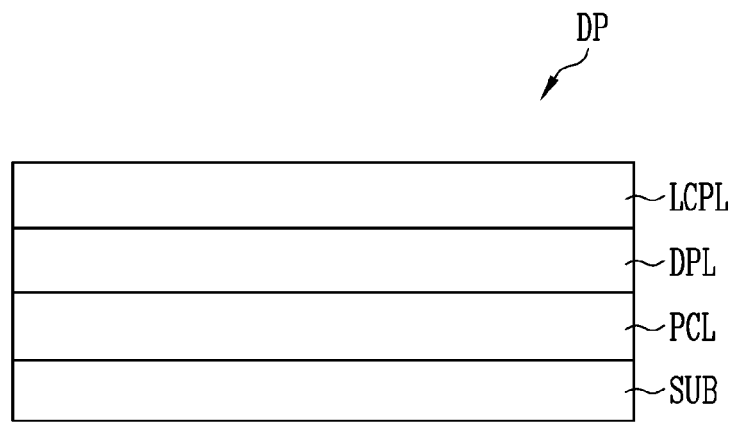
Figure 4C:
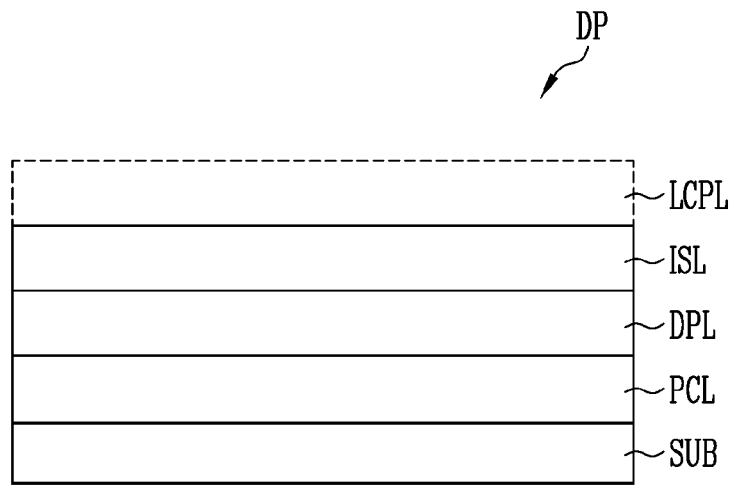

FIG. 1 is a perspective view schematically illustrating a display device in accordance with embodiments. FIG. 2 is a cross-sectional view schematically illustrating the display device shown in FIG. 1. FIG. 3 is a plan view schematically illustrating a display panel included in the display device shown in FIG. 2. FIGS. 4A, 4B, and 4C are cross-sectional views schematically illustrating the display panel shown in FIG. 3.

Referring to FIGS. 1 to 4C, a display device DD may include a display panel DP and a window WD.

The disclosure may be applied as long as the display device DD is an electronic device in which a display surface is applied to at least one surface thereof, such as a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, an automotive display (or vehicle display), a transparent display, or a wearable device (e.g., glasses or a smartwatch).

The display panel DP may have various shapes. In an example, the display panel DP may be provided in the shape of a rectangular plate, but the disclosure is not limited thereto. For example, the display panel DP may have a shape such as a circular shape or an elliptical shape. The display panel DP may include an angular corner and/or a curved corner. For convenience of description, FIG. 1 illustrates that the display device DD is provided in a rectangular shape having a pair of long sides and a pair of short sides. An extending direction of the long sides is designated as a second direction DR2, an extending direction of the short sides is designated as a first direction DR1, and a direction perpendicular to the extending directions of the long sides and the short sides is designated as a third direction DR3.

In an embodiment, at least a portion of the display device DD may have flexibility, and the display device DD may be folded at the portion having the flexibility.

The display device DD may include a display area DD_DA in which an image is displayed and a non-display area DD_NDA provided at at least one side of the display area DD_DA. The non-display area DD_NDA is an area in which an image is not displayed. However, the disclosure is not limited thereto. In some embodiments, shapes of the display area DD_DA and the non-display area DD_NDA may be designed relative to each other.

In some embodiments, the display device DD may include a sensing area and a non-sensing area. The display device DD may not only display an image through the sensing area, but also sense a touch input made on a display surface (or input surface) or sense light incident on the front. The non-sensing area may surround the sensing area. However, this is merely illustrative, and the disclosure is not limited thereto. In some embodiments, a partial area of the display area DD_DA may correspond to the sensing area.

The display panel DP may display an image. A self-luminescent display panel, such as an inorganic light emitting display panel using an inorganic light emitting diode as a light emitting element, a microscale light emitting diode (LED) display panel or nanoscale LED display panel using, as a light emitting element, an LED small to a degree of micrometer scale (or nanometer scale), or a quantum dot organic light emitting display panel (QD OLED panel) using a quantum dot and an inorganic light emitting diode, may be used as the display panel DP. A non-self-luminescent display panel, such as an organic light emitting display panel (OLED panel) using an organic light emitting diode as a light emitting element, a liquid crystal display panel (LCD panel), an electro-phoretic display panel (EPD panel), or an electro-wetting display panel (EWD panel), may be used as the display panel DP. In case that a non-self-luminescent display panel is used as the display panel DP, the display device DD may be provided with a backlight unit (or backlight part) which supplies light to the display panel DP.

As shown in FIG. 3, the display panel DP may include a substrate SUB and pixels PXL provided on the substrate SUB.

The substrate SUB may be provided in various shapes, corresponding to the shape of the display device DD. For example, the substrate SUB may be formed as an area having an approximately rectangular shape. However, the number of areas provided in the substrate SUB may be different from the above-described example, and the substrate SUB may have different shapes according to an area provided in the substrate SUB.

The substrate SUB may be made of an insulative material such as glass or resin. The substrate SUB may be made of a material having flexibility to be bendable or foldable and have a single- or multi-layered structure. For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and the like. However, the material forming the substrate SUB is not limited to the above-described embodiments.

The substrate SUB (or the display panel DP) may include a display area DA and a non-display area NDA. The display area DA may be an area in which the pixels PXL are provided to display an image. The non-display area NDA is an area in which the pixels PXL are not provided, and may be an area in which an image is not displayed.

The display area DA may correspond to the display area DD_DA of the display device DD, and the non-display area NDA may correspond to the non-display area DD_NDA of the display device DD.

A driving unit (or driver) for driving the pixels PXL and some of lines (not shown), which electrically connect the pixels PXL and the driver to each other may be provided in the non-display area NDA. The non-display area NDA may correspond to a bezel area of the display device DD.

The pixels PXL may be provided in the display area DA of the substrate SUB. Each of the pixels PXL may be a minimum unit which displays an image. Each of the pixels PXL may include a light emitting element emitting white light and/or colored light. Each of the pixels PXL may emit light of any one color among red, green, and blue. However, the disclosure is not limited thereto, and each of the pixels PXL may emit light of a color such as cyan, magenta, or yellow.

The pixels PXL may be arranged in a matrix form in rows extending in the first direction DR1 and columns extending in the second direction DR2 intersecting the first direction DR1. However, the arrangement of the pixels PXL is not particularly limited, and the pixels PXL may be arranged in various forms. In the drawings, it is illustrated that the pixels PXL have a rectangular shape. However, the disclosure is not limited thereto, and the pixels PXL may be modified in various shapes. In case that pixels PXL are provided, the pixels PXL may be provided to have different areas (or sizes). For example, in case that pixels PXL having different colors of light emitted therefrom are provided, the pixels PXL may be provided to have different areas (or sizes) or different shapes with respect to the colors.

The driving unit provides a signal to each of the pixels PXL through a line unit (or line(s)) and controls the driving of the pixels PXL. In FIG. 3, the line unit is omitted for convenience of description. The line unit will be described below with reference to FIGS. 5A and 5B.

As shown in FIG. 4A, the display panel DP may include a pixel circuit layer PCL and a display element layer DPL, which are sequentially located on the substrate SUB.

The pixel circuit layer PCL is provided on the substrate SUB and may include transistors and signal lines electrically connected to the transistors. For example, each transistor may have a form in which a semiconductor layer, a gate electrode, a source/drain electrode are sequentially stacked with an insulating layer interposed therebetween. The semiconductor layer may include amorphous silicon, polysilicon such as low temperature polysilicon, an oxide semiconductor, and an organic semiconductor. The gate electrode and the source/drain electrode may include at least one of aluminum (Al), copper (Cu), titanium (Ti), and molybdenum (Mo), but the disclosure is not limited thereto. The pixel circuit layer PCL may include at least one insulating layer.

The display element layer DPL may be disposed on the pixel circuit layer PCL. The display element layer DPL may include a light emitting element which emits light. The light emitting element may be, for example, an inorganic light emitting element including an inorganic light emitting material. However, the disclosure is not limited thereto. For example, the light emitting element may be an organic light emitting diode.

In some embodiments, a thin-film encapsulation layer may be selectively disposed on the display element layer DPL. The thin-film encapsulation layer may be provided in the form of an encapsulation substrate or an encapsulation layer configured as a multi-layer. In case that the thin-film encapsulation layer is provided in the form of the encapsulation layer, the thin-film encapsulation layer may include an inorganic layer and/or an organic layer. For example, the thin-film encapsulation layer may be provided in a form in which an inorganic layer, an organic layer, and an inorganic layer are sequentially stacked. The thin-film encapsulation layer may prevent external air and external moisture from infiltrating into the display element layer DPL and the pixel circuit layer PCL.

In an embodiment, as shown in FIG. 4B, a light conversion pattern layer LCPL may be disposed on the display element layer DPL. The light conversion pattern layer LCPL may change a wavelength (or color) of light emitted from the display element layer DPL by using a quantum dot, and allow light having a specific wavelength (or specific color) to be selectively transmitted therethrough by using a color filter. The light conversion pattern layer LCPL may be formed on a base surface provided by the display element layer DPL by a continuous process, or be formed by an adhesion process using an adhesive layer. The light conversion pattern layer LCPL will be described below with reference to FIGS. 9A and 9B.

It has been described that the light conversion pattern layer LCPL is provided separately from the display element layer DPL, but the disclosure is not limited thereto. For example, the light emitting element provided in the display element layer DPL may be implemented as a light emitting element (or quantum dot light emitting element) which emits light by changing the wavelength of light emitted by using a quantum dot.

In an embodiment, as shown in FIG. 4C, an input sensing layer ISL may be directly disposed on the display element layer DPL. The input sensing layer ISL may sense a contact or input with or to the display surface of the display device DD, which is caused by an external medium such as a finger or a pen. In an embodiment, the phrase "being directly disposed" excludes being attached by using a separate adhesive layer (or cohesive layer), and may mean being formed by a continuous process. However, the disclosure is not limited thereto, and the input sensing layer ISL may be formed by an adhesion process using an adhesive layer. The input sensing layer ISL will be described below with reference to FIG. 10. The light conversion pattern layer LCPL may be selectively disposed on the input sensing layer ISL.

Referring back to FIG. 2, the window WD for protecting an exposed surface of the display panel DP may be provided on the display panel DP. The window WD may protect the display panel DP from external impact, and provide an input surface and/or a display surface to a user. The window WD may be coupled to the display panel DP by using an optically clear adhesive (or cohesive) member OCA.

The window WD may have a multi-layered structure selected from a glass substrate, a plastic film, and a plastic substrate. This multi-layered structure may be formed by a continuous process or an adhesion process using an adhesive layer. The whole or a portion of the window WD may have flexibility.

Figure 5A:
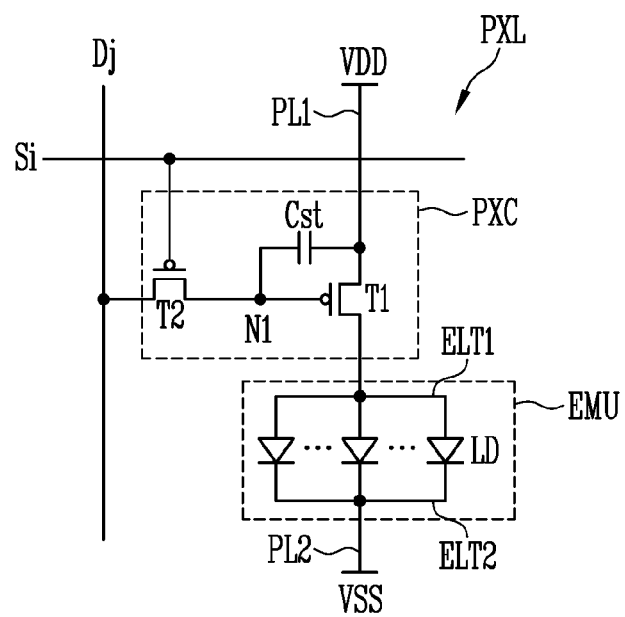
FIGS. 5A and 5B are circuit diagrams schematically illustrating embodiments of an electrical connection relationship between components included in a pixel included in the display panel shown in FIG. 3.
Figure 5B:
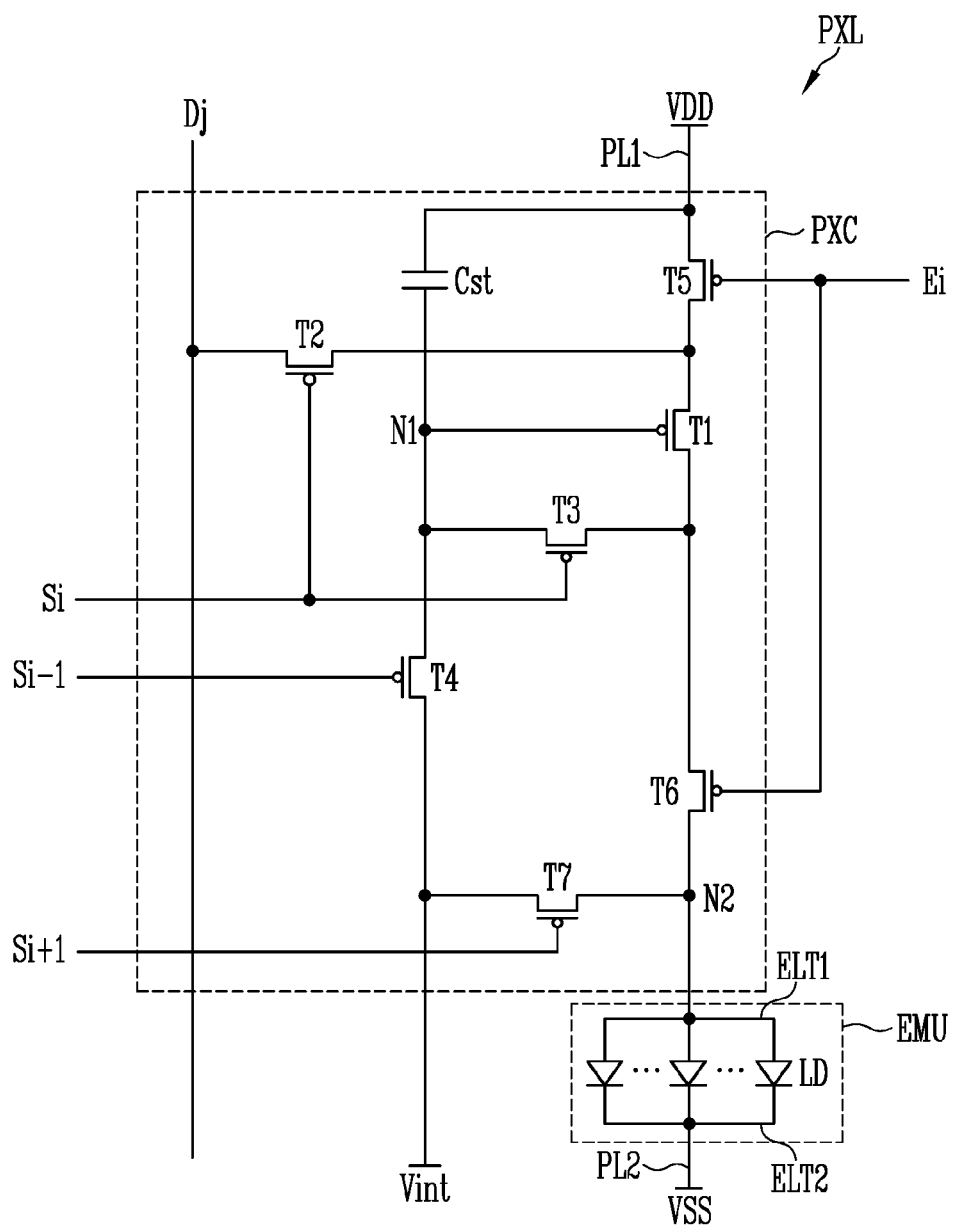

FIGS. 5A and 5B are circuit diagrams schematically illustrating embodiments of an electrical connection relationship between components included in a pixel included in the display panel shown in FIG. 3. Different embodiments of an electrical connection relationship between components included in a pixel PXL which can be applied to an active type display device are illustrated in FIGS. 5A and 5B. However, kinds of components included in a pixel PXL to which the embodiment can be applied are not limited thereto.

As illustrated in FIGS. 5A and 5B, in addition to components included in each pixel PXL shown in FIG. 3, even an area in which the components are provided is inclusively designated as the pixel PXL. In some embodiments, each of pixels PXL shown in FIGS. 5A and 5B may be any of the pixels PXL provided in the display panel DP shown in FIG.

3, and the pixels PXL may have structures substantially identical or similar to each other.

Referring to FIGS. 1 to 4C, 5A, and 5B, a pixel PXL (hereinafter, referred to as a "pixel") may include a light emitting part EMU which generates light with a luminance corresponding to a data signal. The pixel PXL may selectively further include a pixel driving circuit PXC (or pixel circuit) for driving the light emitting part EMU.

In some embodiments, the light emitting part EMU may include at least one light emitting element LD electrically connected in parallel between a first power line PL1 to which a voltage of a first driving power source VDD is applied and a second power line PL2 to which a voltage of a second driving power source VSS is applied. For example, the light emitting part EMU may include a first electrode ELT1 electrically connected to the first driving power source VDD via the pixel driving circuit PXC and the first power line PL1, a second electrode ELT2 electrically connected to the second driving power source VSS through the second power line PL2, and light emitting elements LD electrically connected in parallel in the same direction between the first and second electrodes ELT1 and ELT2. In an embodiment, the first electrode ELT1 may be an anode electrode, and the second electrode ELT2 may be a cathode electrode.

In an embodiment, each of the light emitting elements LD included in the light emitting part EMU may include a first end portion electrically connected to the first driving power source VDD through the first electrode ELT1 and a second end portion electrically connected to the second driving power source VSS through the second electrode ELT2. The first driving power source VDD and the second driving power source VSS may have different potentials. In an example, the first driving power source VDD may be set as a high-potential power source, and the second driving power source VSS may be set as a low-potential power source. A potential difference between the first and second driving power sources VDD and VSS may be set to be equal to or higher than a threshold voltage of the light emitting elements LD during an emission period of the pixel PXL.

As described above, the light emitting elements LD electrically connected in parallel in the same direction (e.g., a forward direction) between the first electrode ELT1 and the second electrode ELT2, to which voltages having difference potentials are supplied, may form effective light sources, respectively. These effective light sources may form (or constitute) the light emitting part EMU of the pixel PXL.

The light emitting element LD of the light emitting part EMU may emit light with a luminance corresponding to a driving current supplied through a corresponding pixel driving circuit PXC. For example, the pixel driving circuit PXC may supply, to the light emitting part EMU, a driving current corresponding to a grayscale value of corresponding frame data during each frame period. The driving current supplied to the light emitting part EMU may be divided to flow through the light emitting elements LD. Accordingly, the light emitting part EMU can emit light with a luminance corresponding to the driving current while each light emitting element LD emits light with a luminance corresponding to a current flowing therethrough.

The pixel driving circuit PXC may be electrically connected to a scan line Si and a data line Dj of a corresponding pixel PXL. In an example, in case that assuming that the pixel PXL is disposed in an i-th row (where i is a positive integer) and a j-th column (where j is a positive integer) of the display area DA, the pixel driving circuit PXC of the pixel PXL may be electrically connected to an i-th scan line Si and a j-th data line Dj of the display area DA. In some embodiments, the pixel driving circuit PXC may include first and second transistors T1 and T2 and a storage capacitor Cst as shown in FIG. 5A. However, the structure of the pixel driving circuit PXC is not limited to the embodiment shown in FIG. 5A.

First, referring to FIG. 5A, the pixel driving circuit PXC may include the first and second transistors T1 and T2 and the storage capacitor Cst.

A first terminal of the first transistor T1 (or driving transistor) may be electrically connected to the first driving power source VDD, and a second terminal of the first transistor T1 may be electrically connected to the light emitting element LD. A gate electrode of the first transistor T1 may be electrically connected to a first node N1. The first transistor T1 controls an amount of driving current supplied to the light emitting element LD in response to a voltage of the first node N1.

A first terminal of the second transistor T2 (or switching transistor) may be electrically connected to the data line Dj, and a second terminal of the second transistor T2 may be electrically connected to the first node N1. The first terminal and the second terminal of the second transistor T2 are different terminals. For example, in case that the first terminal is a source electrode, the second terminal may be a drain electrode. In addition, a gate electrode of the second transistor T2 may be electrically connected to the scan line Si.

The second transistor T2 is turned on in case that a scan signal having a voltage (e.g., a low voltage) at which the second transistor T2 can be turned on is supplied from the scan line Si, to electrically connect the data line Dj and the first node N1 to each other. A data signal of a corresponding frame is supplied to the data line Dj. Accordingly, the data signal is transferred to the first node N1. The data signal transferred to the first node N1 is stored in the storage capacitor Cst.

An electrode of the storage capacitor Cst may be electrically connected to the first driving power source VDD, and another electrode of the storage capacitor Cst may be electrically connected to the first node N1. The storage capacitor Cst charges a voltage corresponding to the data signal supplied to the first node N1 and maintains the charged voltage until a data signal of a next frame is supplied thereto.

FIG. 5A illustrates the pixel driving circuit PXC that includes the second transistor T2 for transferring a data signal to the inside of the pixel PXL, the storage capacitor Cst for storing the data signal, and the first transistor T1 for supplying a driving current corresponding to the data signal to the light emitting elements LD.

However, the disclosure is not limited thereto, and the structure of the pixel driving circuit PXC may be variously modified and embodied. In an example, the pixel driving circuit PXC may further include at least one transistor element such as a transistor element for compensating for a threshold voltage of the first transistor T1, a transistor element for initializing the first node N1, and/or a transistor element for controlling an emission time of the light emitting elements LD, or other circuit elements such as a boosting capacitor for boosting the voltage of the first node N1.

FIG. 5A illustrates that the transistors, e.g., the first and second transistors T1 and T2, included in the pixel driving circuit PXC are P-type transistors, but the disclosure is not limited thereto. For example, at least one of the first and second transistors T1 and T2 included in the pixel driving circuit PXC may be changed to an N-type transistor. Connection positions of some components may be changed due to a transistor type change. For example, the storage capacitor Cst may be electrically connected between the gate electrode and the second terminal of the first transistor T1, or the light emitting part EMU may be electrically connected between the first driving power source VDD and the pixel driving circuit PXC.

In some embodiments, the pixel driving circuit PXC may be configured as in the embodiment shown in FIG. 5B.

Referring to FIG. 5B, the pixel driving circuit PXC may be electrically connected to a scan line Si and a data line Dj of the pixel PXL. In an example, in case that the pixel PXL is disposed in an i-th row and a j-th column of the display area DA, the pixel driving circuit PXC of the corresponding pixel PXL may be electrically connected to an i-th scan line Si and a j-th data line Dj of the display area DA.

In some embodiments, the pixel driving circuit PXC may be further electrically connected to at least another scan line. For example, the pixel PXL disposed in the i-th row of the display area DA may be further electrically connected to an (i−1)th scan line Si−1 and/or an i+1-th scan line Si+1. In some embodiments, the pixel driving circuit PXC may be further electrically connected to a third power source in addition to the first and second driving power sources VDD and VSS. For example, the pixel driving circuit PXC may be electrically connected to an initialization power source Vint.

The pixel driving circuit PXC may include first to seventh transistors T1 to T7 and a storage capacitor Cst.

A first terminal, e.g., a source electrode of the first transistor T1 (or driving transistor) may be electrically connected to the first driving power source VDD via the fifth transistor T5, and a second terminal, e.g., a drain electrode of the first transistor T1 may be electrically connected to an end portion of each of the light emitting element LD via the sixth transistor T6. A gate electrode of the first transistor T1 may be electrically connected to a first node N1. The first transistor T1 controls a driving current flowing between the first driving power source VDD and the second driving power source VSS via the light emitting elements LD in response to a voltage of the first node N1.

The second transistor T2 (the switching transistor) may be electrically connected between the j-th data line Dj electrically connected to the pixel PXL and the source electrode of the first transistor T1. A gate electrode of the second transistor T2 may be electrically connected to the i-th scan line Si electrically connected to the pixel PXL. In case that a scan signal having a gate-on voltage (e.g., a low voltage) is supplied from the i-th scan line Si, the second transistor T2 may be turned on to electrically connect the j-th data line Dj to the source electrode of the first transistor T1. Therefore, in case that the second transistor T2 is turned on, a data signal supplied from the j-th data line Dj is transferred to the first transistor T1.

The third transistor T3 may be electrically connected between the drain electrode of the first transistor T1 and the first node N1. A gate electrode of the third transistor T3 may be electrically connected to the i-th scan line Si. In case that the scan signal having the gate-on voltage is supplied from the i-th scan line Si, the third transistor T3 may be turned on to electrically connect the drain electrode of the first transistor T1 and the first node N1 to each other.

The fourth transistor T4 may be electrically connected between the first node N1 and an initialization power line to which the initialization power source Vint is applied. A gate electrode of the fourth transistor T4 may be electrically connected to a previous scan line, e.g., the (i−1)th scan line Si−1. In case that the scan signal having the gate-on voltage is supplied from the (i−1)th scan line Si−1, the fourth transistor T4 may be turned on to transfer a voltage of the initialization power source Vint to the first node N1. The initialization power source Vint may have a voltage level lower than an optimum voltage level of the data signal.

The fifth transistor T5 may be electrically connected between the first driving power source VDD and the first transistor T1. A gate electrode of the fifth transistor T5 may be electrically connected to a corresponding emission control line, e.g., an i-th emission control line Ei. The sixth transistor T6 may be electrically connected between the first transistor T1 and an end portion of each of the light emitting elements LD (or a second node N2). A gate electrode of the sixth transistor T6 may be electrically connected to an i-th emission control line Ei. In case that an emission control signal having a gate-off voltage is supplied to the i-th emission control line Ei, the fifth and sixth transistors T5 and T6 may be turned off, and the fifth and sixth transistors T5 and T6 may be turned on in other cases.

The seventh transistor T7 may be electrically connected between an end portion of each of the light emitting elements LD and the initialization power line. A gate electrode of the seventh transistor T7 may be electrically connected to any one of scan lines of a next stage, e.g., the i+1-th scan line Si+1. In case that the scan signal having the gate-on voltage is supplied to the i+1-th scan line Si+1, the seventh transistor T7 may be turned on to supply the voltage of the initialization power source Vint to the end portion of each of the light emitting elements LD.

The storage capacitor Cst may be electrically connected between the first driving power source VDD and the first node N1. The storage capacitor Cst may store a voltage corresponding to the data signal supplied to the first node N1 and a threshold voltage of the first transistor T1 in each frame period.

Although FIG. 5B illustrates that the transistors, e.g., the first to seventh transistors T1 to T7, included in the pixel driving circuit PXC are P-type transistors, the disclosure is not limited thereto. For example, at least one of the first to seventh transistors T1 to T7 may be changed to an N-type transistor.

The structure of a pixel PXL which can be applied to the disclosure is not limited to the embodiments shown in FIGS. 5A and 5B, the corresponding pixel PXL may have the various structures. In an embodiment, each pixel PXL may be configured at the inside of a passive type light emitting display device or the like. In this case, the pixel driving circuit PXC may be omitted, and both end portions of the light emitting elements LD included in the light emitting part EMU may be directly electrically connected to each of the scan lines Si−1, Si, and Si+1, the data line Dj, the first power line PL1 to which the first driving power source VDD is applied, the second power line PL2 to which the second driving power source VSS is applied, and/or a control line.

Figure 6A:
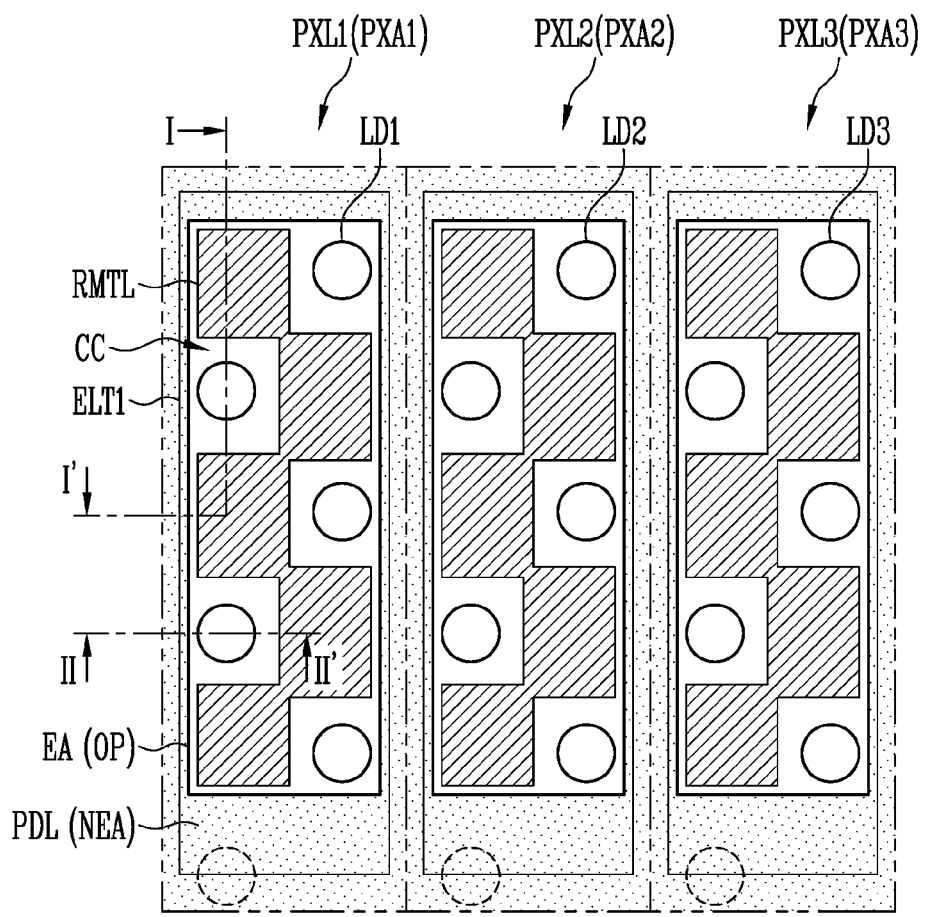
FIGS. 6A, 6B, and 6C schematically illustrate the pixel included in the display panel shown in FIG. 3, and are schematic plan views illustrating the pixel viewed from the top, based on a light emitting unit shown in FIGS. 5A and 5B.
Figure 6B:
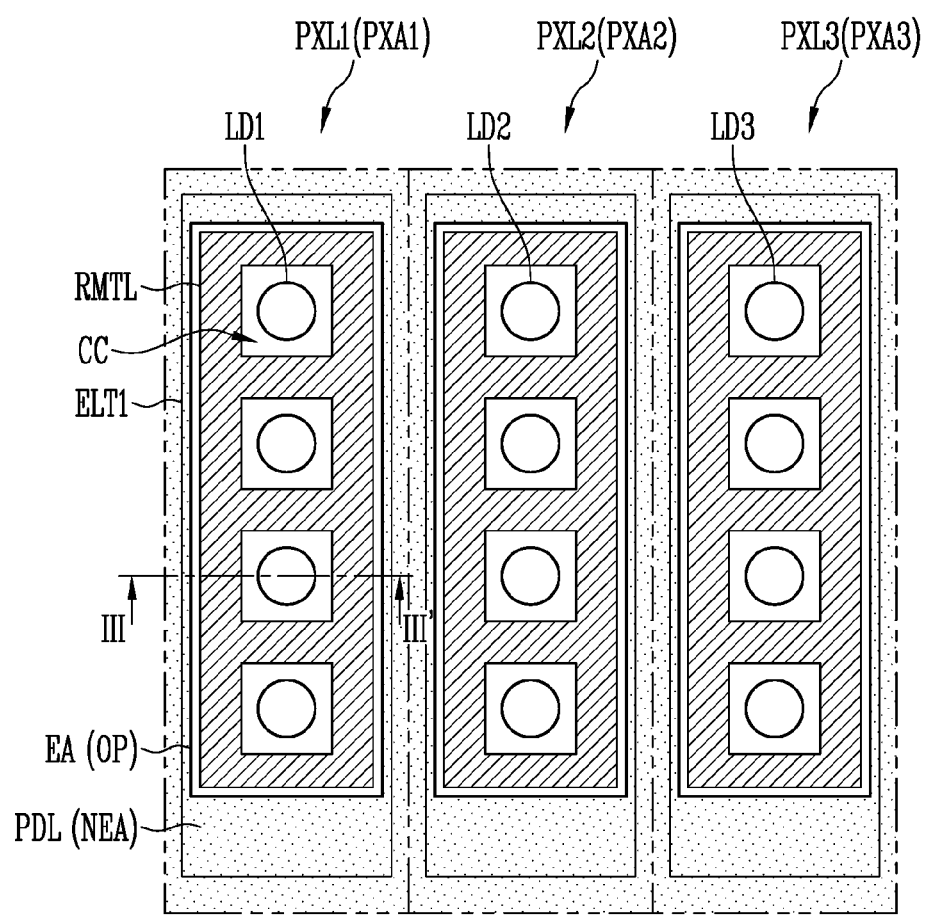
Figure 6C:
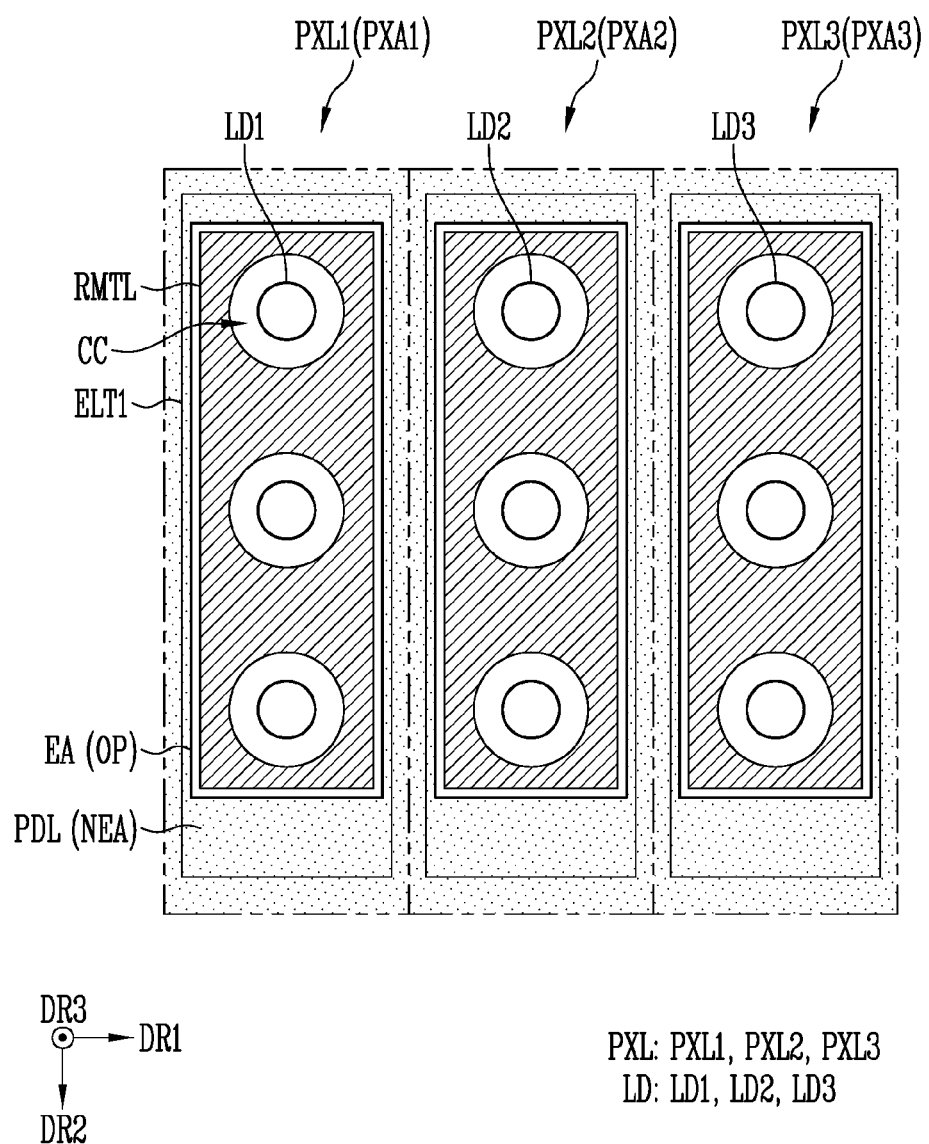

FIGS. 6A, 6B, and 6C schematically illustrate the pixel included in the display panel shown in FIG. 3, and are schematic plan views illustrating the pixel viewed from the top, based on the light emitting part EMU shown in FIGS. 5A and 5B.

Referring to FIGS. 3 and 6A to 6C, the display panel DP may include a first pixel PXL1 (or first pixel area PXA1), a second pixel PXL2 (or second pixel area PXA2), and a third pixel PXL3 (or third pixel area PXA3). The first pixel PXL1, the second pixel PXL2, and the third pixel PXL3 may form a pixel (or unit pixel).

In some embodiments, the first, second, and third pixels PXL1, PXL2, and PXL3 may emit light of different colors.

In an example, the first pixel PXL1 may be a red pixel emitting light of red, the second pixel PXL2 may be a green pixel emitting light of green, and the third pixel PXL3 may be a blue pixel emitting light of blue. However, the colors, kind, and/or number of the pixels PXL1, PXL2, and PXL3 forming the unit pixel are not particularly limited. In an example, the color of light emitted from each of the pixels PXL may be variously changed. In some embodiments, the first, second, and third pixels PXL1, PXL2, and PXL3 may emit light of the same color. For example, the first, second, and third pixels PXL1, PXL2, and PXL3 may be blue pixels emitting light of blue.

The first pixel PXL1, the second pixel PXL2, and the third pixel PXL3 are substantially identical or similar to one another. Therefore, hereinafter, the first pixel PXL1 will be described, including the first pixel PXL1, the second pixel PXL2, and the third pixel PXL3.

The first pixel PXL1 may include a first electrode ELT1, a pixel defining layer PDL (or bank), and a reflection pattern RMTL (e.g., reflection member, protrusion part, or protrusion pattern).

The first electrode ELT1 may be located in an emission area EA of the first pixel area PXA1. The first electrode ELT1 may extend from the emission area EA to a non-emission area NEA. The first electrode ELT1 may be spaced apart from a first electrode ELT1 of another pixel (e.g., the second pixel PXL2).

The first electrode ELT1 may guide light emitted from light emitting elements LD in the third direction DR3. To this end, the first electrode ELT1 may be made of a conductive material (or substance) having a constant reflexibility. The conductive material (or substance) may include an opaque metal. The opaque metal may include, for example, a metal such silver (Ag), magnesium (Mg), aluminum (Al), platinum (Pt), palladium (Pd), gold (Au), neodymium (Nd), iridium (Ir), chromium (Cr), titanium (Ti), molybdenum (Mo), or any alloy thereof.

In some embodiments, the first electrode ELT1 may have a multi-layered structure including electrode layers. The first electrode ELT1 may include a first electrode layer and a second electrode layer, which are sequentially stacked in the third direction DR3. One of the first electrode layer and the second electrode layer may have a relatively high electrical conductivity (or conductivity), and the other of the first electrode layer and the second electrode layer may have a relatively high reflexibility. For example, the first electrode layer may be made of a low-resistance material to decrease resistance (or contact resistance), and the second electrode layer may include a material having a constant reflexibility to allow light emitted from the light emitting elements LD to advance in the third direction DR3. For example, the first electrode layer includes metals such as molybdenum (Mo), titanium (Ti), copper (Cu), aluminum (Al), silver (Ag), and any alloy thereof, and may include a metal (e.g., molybdenum (Mo)) having an electrical conductivity higher than that of the second electrode layer. For example, the second electrode layer includes metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and any alloy thereof, and may include a metal (e.g., aluminum (Al)) having reflexibility higher than that of the first electrode layer.

In some embodiments, the first electrode ELT1 may include a transparent conductive material (or substance). The transparent conductive material (or substance) may include a conductive oxide such as indium tin oxide (ITO), indium zinc oxide (IZO), zinc oxide (ZnO), indium gallium zinc oxide (IGZO), or indium tin zinc oxide (ITZO) and a conductive polymer such as poly(3,4-ethylenedioxythiophene) (PEDOT), and the like.

The pixel defining layer PDL may be located in the non-emission area NEA of the first pixel area PXA1. The pixel defining layer PDL may partially overlap an edge of the first electrode ELT1, but the disclosure is not limited thereto. The pixel defining layer PDL may be formed between pixels PXL while surrounding the emission area EA to define (or partition) an emission area EA of each pixel PXL. The emission area EA may correspond to an opening OP of the pixel defining layer PDL. In a process of disposing light emitting elements LD, the pixel defining layer PDL may prevent the light emitting elements LD (e.g., a light emitting element indicated by a dotted line) from being disposed in the non-emission area NEA. Also, the pixel defining layer PDL may prevent a failure (e.g., a short circuit) from occurring in case that the light emitting elements LD are electrically connected to the first electrode ELT1 and another component in the non-emission area NEA.

The pixel defining layer PDL may include an insulating material including an inorganic material and/or an organic material. In an example, the pixel defining layer PDL may include at least one inorganic layer including various inorganic insulating materials including silicon nitride ($SiN_x$), silicon oxide ($SiO_x$), or the like. As another example, the pixel defining layer PDL may include at least one organic layer including various organic insulating materials and/or a photoresist layer, or be configured as a single- or multi-layered insulator including a combination of organic/inorganic materials. For example, the material forming the pixel defining layer PDL may be variously changed.

In an embodiment, the pixel defining layer PDL may include at least one light blocking material and/or at least one reflective material to prevent a light leakage defect in which light (or beam) is leaked between pixels PXL. In some embodiments, the pixel defining layer PDL may include a transparent material (or substance). The transparent material (or substance) may include, for example, polyamides resin, polyimides resin, etc., but the disclosure is not limited thereto. In some embodiments, a reflective material layer (or reflective layer) may be separately provided and/or formed on the pixel defining layer PDL so as to further improve the efficiency of light emitted from each pixel PXL.

The reflection pattern RMTL may be provided in the emission area EA. The reflection pattern RMTL may overlap the first electrode ELT1 and form concave parts CC (or openings). The concave part CC may be a part further recessed than top surfaces of the reflection pattern RMTL and the pixel defining layer PDL, or be a part exposing the first electrode ELT1 (e.g., the opening of the reflection pattern RMTL). For example, the reflection pattern RMTL may protrude from the first electrode ELT1 in the third direction DR3. The concave part CC surrounded by the reflection pattern RMTL and the pixel defining layer PDL may be formed or defined.

The reflection pattern RMTL may be spaced apart from the pixel defining layer PDL, but the disclosure is not limited thereto. For example, when viewed in a plan view, the reflection pattern RMTL may contact the pixel defining layer PDL. In an example, similar to the first electrode ELT1, the reflection pattern RMTL may partially overlap the pixel defining layer PDL when viewed in a plan view. This will be described below with reference to FIG. 7C.

As shown in FIG. 6A, the concave parts CC may be arranged in oblique directions each intersecting the first direction DR1 and the second direction DR2. For example, the concave parts CC may be arranged in the form of a checkerboard (e.g., a lattice or mosaic). However, the disclosure is not limited thereto, and the concave parts CC may be arranged in the second direction DR2 in the emission area EA as shown in FIGS. 6B and 6C. The arrangement of the concave parts CC may be changed depending on the arrangement of light emitting elements LD.

The concave part CC may have various planar shapes such as a circular shape, a quadrangular shape, and a polygonal shape. For example, the concave part CC may have a quadrangular planar shape as shown in FIGS. 6A and 6B, or have a circular planar shape as shown in FIG. 6C. The concave part CC may have a shape such as a triangular shape, a hexagonal shape, or an octagonal shape, and at least a portion of the concave part CC may be configured as a curve. Also, the concave part CC may have a closed loop, or a portion of the concave part CC may be opened (see FIG. 6A).

The reflection pattern RMTL may guide light emitted from the light emitting elements LD in the third direction DR3. To this end, the reflection pattern RMTL may be made of a conductive material having a constant reflexibility. The conductive material may include an opaque metal. The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and an alloy thereof.

In some embodiments, the reflection pattern RMTL and the first electrode ELT1 may be formed by the same process, or the reflection pattern RMTL may be integrally formed with (or integral with) the first electrode ELT1. For example, the reflection pattern RMTL may be a portion protruding from the first electrode ELT1 in the third direction DR3. In case that the first electrode ELT1 includes a first electrode layer and a second electrode layer, which are sequentially stacked, the reflection pattern RMTL may form the second electrode layer or be a portion of the second electrode layer that protrudes in the third direction DR3.

The light emitting elements LD are provided in the emission area EA, and each of the light emitting elements LD may be disposed in the concave part CC. First light emitting elements LD1 may be provided in concave parts CC of the emission area EA of the first pixel PXL1, second light emitting elements LD2 may be provided in concave parts CC of an emission area EA of the second pixel PXL2, and third light emitting elements LD3 may be provided in concave parts CC of an emission area EA of the third pixel PXL3. One light emitting element LD may be disposed in one concave part CC. For example, the reflection pattern RMTL may be disposed between a light emitting element LD and an adjacent light emitting element LD and prevent light emitted from the light emitting element LD from advancing toward an area corresponding to the adjacent light emitting element LD. A detailed configuration of the light emitting element LD will be described below with reference to FIG. 11.

The light emitting element LD may be located within a specific distance from an edge of the concave part CC. The specific distance may be differently set according to a depth of the concave part CC (or a height of the reflection pattern RMTL in the third direction DR3) and a length of the light emitting element LD (i.e., a length of the light emitting element LD in the third direction DR3). For example, a distance between the light emitting element LD and the edge of the concave part CC may be smaller than or equal to a diameter of the light emitting element LD (or a width of the light emitting element LD in the first direction DR1 or the second direction DR2).

For example, the reflection pattern RMTL may be disposed within a specific distance from the light emitting element LD to surround the light emitting element LD. In this case, light emitted from the light emitting element LD can be prevented from advancing toward another pixel PXL (or an area corresponding to another light emitting element LD), and the another pixel PXL can emit light with a desired luminance. In addition, the reflection pattern RMTL guides light emitted from the light emitting element LD in the third direction DR3, so that the light emission efficiency of the pixel PXL can be improved.

In case that a reflection structure corresponding to the reflection pattern RMTL is formed by using the pixel defining layer PDL, it may be difficult for the reflection structure to have a desired inclined surface (i.e., an inclined surface or a surface profile, which has an inclined angle for guiding light emitted from the light emitting element LD in the third direction DR3) by a property of the material forming the pixel defining layer PDL (e.g., a light blocking property of the light blocking material), in a relatively small area such as the concave part CC. The reflection pattern RMTL is to be disposed on the reflection structure in relation to the light emission efficiency of the pixel PXL.

As described above, the reflection pattern RMTL is disposed within a specific distance from the light emitting element LD to surround the light emitting element LD, so that the pixel PXL can emit light with a desired luminance. Accordingly, the light emission efficiency of the pixel PXL can be improved.

Figure 7A:
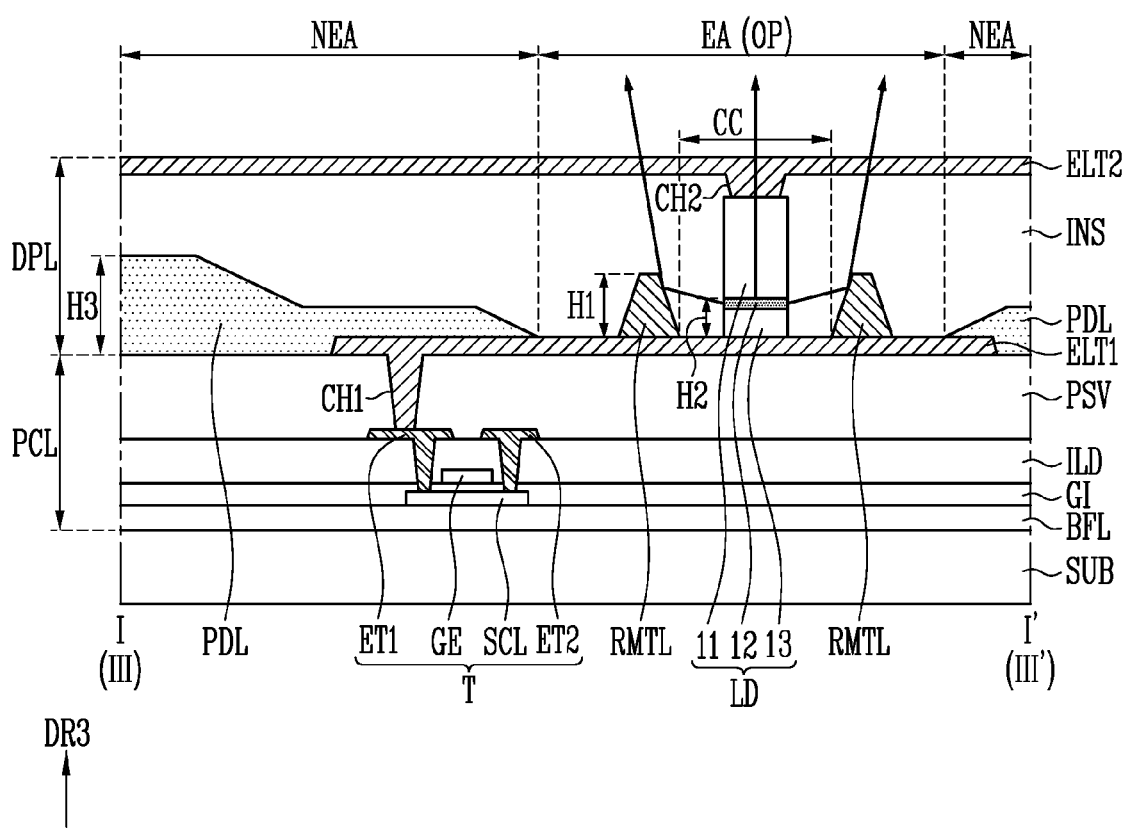
FIGS. 7A, 7B, and 7C are cross-sectional views illustrating an embodiment of the pixel taken along line I-I' shown in FIG. 6A.
Figure 7B:
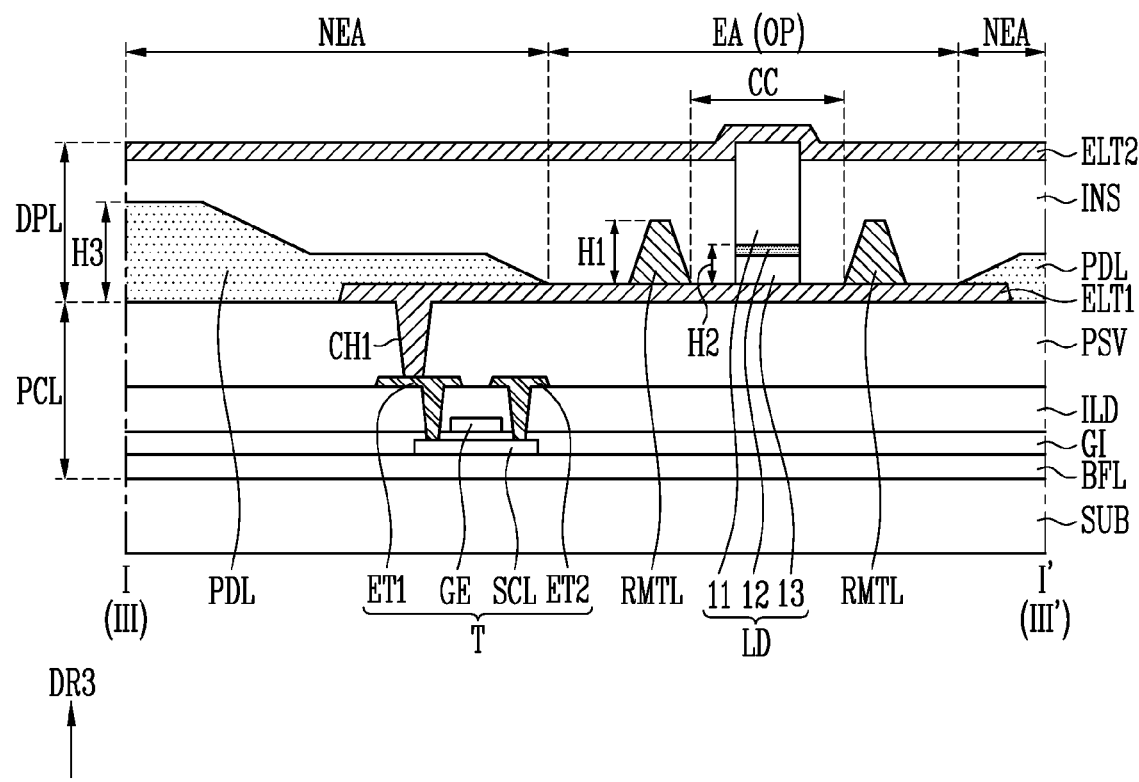
Figure 7C:
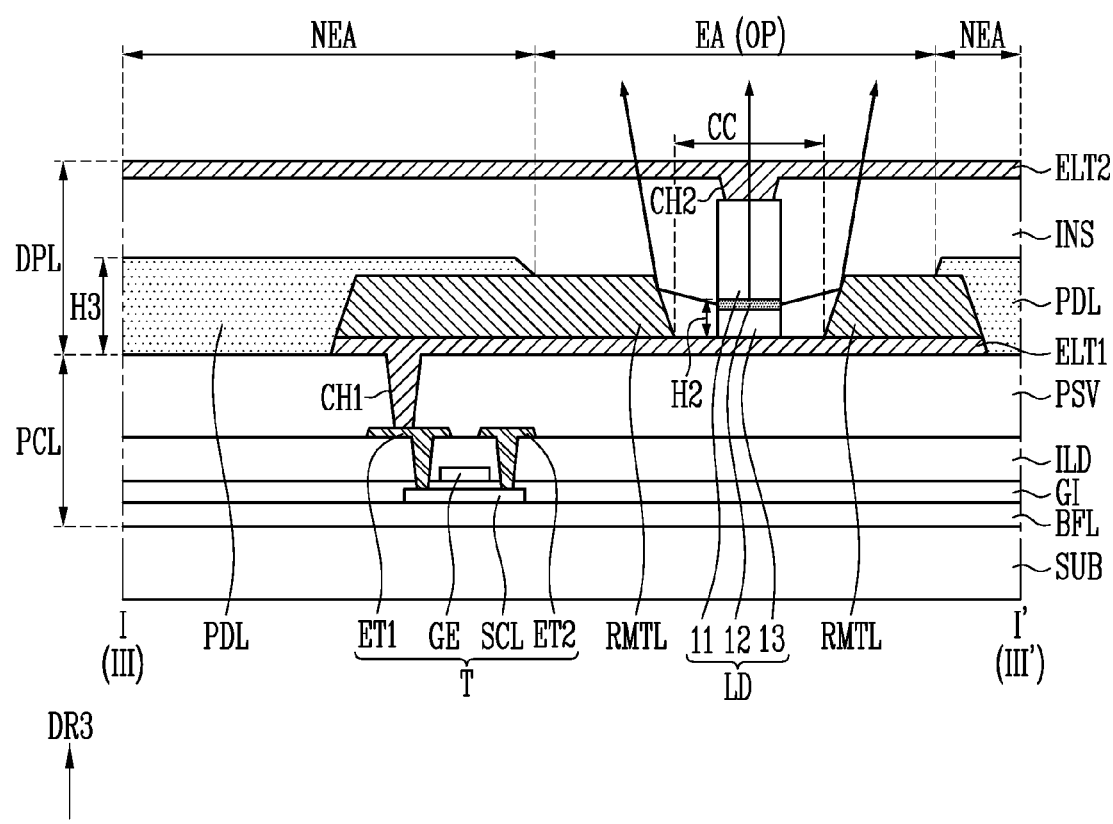

FIGS. 7A, 7B, and 7C are schematic cross-sectional views illustrating an embodiment of the pixel taken along line I-I' shown in FIG. 6A. FIGS. 7A to 7C illustrate a transistor T (e.g., the first transistor T1 shown in FIG. 5A or the sixth transistor T6 shown in FIG. 5B) as an example of circuit elements which may be disposed in a pixel circuit layer PCL. In addition, FIGS. 7A, 7B, and 7C may correspond to a section taken along line shown in FIG. 6B.

In FIGS. 7A to 7C, a pixel PXL is simplified and illustrated, such as a case where each electrode is illustrated as only a single-layered electrode and a case where each of insulating layers is illustrated as only a single-layered insulating layer. However, the disclosure is not limited thereto.

In an embodiment, as long as any other description is not provided, the term "being formed and/or provided in the same layer" may mean "being formed in the same process," and the term "being formed and/or provided in different layers" may mean "being formed by different processes."

Referring to FIGS. 1 to 3, 6A to 6C, and 7A to 7C, the pixel circuit layer PCL and a display element layer DPL (or light emitting element layer) may be sequentially disposed on the substrate SUB. In some embodiments, the pixel circuit layer PCL and the display element layer DPL may be entirely formed in the display area DA of the display panel DP (see FIG. 3).

The pixel circuit layer PCL may include a buffer layer BFL, a transistor T, and a protective layer PSV. As shown in FIGS. 7A to 7C, the buffer layer BFL, the transistor T, and the protective layer PSV may be sequentially stacked on the substrate SUB.

The buffer layer BFL may prevent an impurity from being diffused into the transistor T. The buffer layer BFL may be an inorganic insulating layer including an inorganic material. The buffer layer BFL may include, for example, at least one of silicon nitride ($SiN_x$), silicon oxide ($SiO_x$), silicon oxynitride ($SiO_xN_y$), and metal oxide such as aluminum oxide ($AlO_x$). The buffer layer BFL may be provided as a single layer, or may be provided as a multi-layer including at least two layers. In case that the buffer layer BFL is provided as the multi-layer, the layers may be formed of (or include) the same material or different materials. The buffer layer BFL may be omitted according to the material and process conditions of the substrate SUB.

The transistor T may be the first transistor T1 shown in FIG. 5A or the sixth transistor T6 shown in FIG. 5B. The structure of each of the second transistor T2 shown in FIG. 5A and the first to seventh transistors T1 to T7 shown in FIG. 5B may be substantially identical or similar to that of the transistor T.

The transistor T may include a semiconductor pattern SCL, a gate electrode GE, a first terminal ET1, and a second terminal ET2. The first terminal ET1 may be any one of a source electrode and a drain electrode, and the second terminal ET2 may be the other of the source electrode and the drain electrode. In an example, in case that the first terminal ET1 is the drain electrode, the second terminal ET2 may be the source electrode.

The semiconductor pattern SCL may be provided and/or formed on the buffer layer BFL. The semiconductor pattern SCL may include a first contact region contacting the first terminal ET1 and a second contact region contacting the second terminal ET2. A region between the first contact region and the second contact region may be a channel region. The channel region may overlap the gate electrode GE of the corresponding transistor T. The semiconductor pattern SCL may be a semiconductor pattern made of amorphous silicon, polysilicon such as low-temperature polysilicon, an oxide semiconductor, an organic semiconductor, or the like. The channel region is a semiconductor pattern not doped with an impurity and may be an intrinsic semiconductor. Each of the first contact region and the second contact region may be a semiconductor pattern doped with an impurity.

A gate insulating layer GI may be provided and/or formed over the semiconductor pattern SCL. The gate insulating layer GI may be an inorganic insulating layer including an inorganic material. In an example, the gate insulating layer GI and the buffer layer BFL may include the same material, or the gate insulating layer GI may include at least one material selected from the materials exemplified as the material forming the buffer layer BFL. In some embodiments, the gate insulating layer GI may be an organic insulating layer including an organic material. The gate insulating layer GI may be provided as a single layer, or may be provided as a multi-layer including at least two layers.

The gate electrode GE may be provided and/or formed on the gate insulating layer GI to correspond to the channel region of the semiconductor pattern SCL. The gate electrode GE may be provided on the gate insulating layer GI to overlap the channel region of the semiconductor pattern SCL. The gate electrode GE may be formed in a single layer including at least one selected from the group consisting of copper (Cu), molybdenum (Mo), tungsten (W), neodymium (Nd), titanium (Ti), aluminum (Al), silver (Ag), and any alloy thereof, or a mixture thereof, or may be formed in a double- or multi-layered structure including molybdenum (Mo), titanium (Ti), copper (Cu), aluminum (Al), or silver (Ag), which is a low-resistance material so as to decrease wiring resistance.

An interlayer insulating layer ILD may be provided and/or formed over the gate electrode GE. The interlayer insulating layer ILD and the gate insulating layer GI may include the same material, or the interlayer insulating layer ILD may include at least one material selected from the materials exemplified as the material forming the gate insulating layer GI.

Each of the first terminal ET1 and the second terminal ET2 may be provided and/or formed on the interlayer insulating layer ILD, and may contact the first contact region and the second contact region of the semiconductor pattern SCL through contact holes sequentially penetrating the gate insulating layer GI and the interlayer insulating layer ILD. Each of the first terminal ET1 and the second terminal ET2 and the gate electrode GE may include the same material, or each of the first terminal ET1 and the second terminal ET2 may include at least one material selected from the materials exemplified as the material forming the gate electrode GE.

In the above-described embodiment, it has been described that the first and second terminals ET1 and ET2 of the transistor T are separate electrodes electrically connected to the semiconductor pattern SCL through contact holes sequentially penetrating the gate insulating layer GI and the interlayer insulating layer ILD, but the disclosure is not limited thereto. In some embodiments, the first terminal ET1 of the transistor T may be the first contact region adjacent to the channel region of the corresponding semiconductor pattern SCL, and the second terminal ET2 of the transistor T may be the second contact region adjacent to the channel region of the corresponding semiconductor pattern SCL. The first terminal ET1 of the transistor T may be electrically connected to the light emitting elements LD through a separate connection means such as a bridge electrode.

Although FIGS. 7A to 7C illustrate that the transistor T is a thin-film transistor having a top gate structure, as an example, the disclosure is not limited thereto, and the structure of the transistor T may be variously modified. For example, the transistor T may have a bottom gate structure, a dual gate structure, or a double gate structure.

The protective layer PSV may be provided and/or formed over the transistor T.

The protective layer PSV may be provided in a form including an organic insulating layer, an inorganic insulating layer, or an organic insulating layer disposed on an inorganic insulating layer. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). For example, the organic insulating layer may include at least one of polyacrylates resin, epoxy resin, phenolic resin, polyamides resin, polyimides resin, unsaturated polyesters resin, poly-phenylene ethers resin, poly-phenylene sulfides resin, and benzocyclobutenes resin.

The protective layer PSV may include a first contact hole CH1 exposing the first terminal ET1 of the transistor T.

The display element layer DPL may be provided on the protective layer PSV.

The display element layer DPL may include a first electrode ELT1, a reflection pattern RMTL, a pixel defining layer PDL, a light emitting element LD (or light emitting elements), an insulating layer INS, and a second electrode ELT2. The first electrode ELT1, the reflection pattern RMTL, the pixel defining layer PDL, the light emitting element LD, the insulating layer INS, and the second electrode ELT2 may be sequentially disposed or formed on the pixel circuit layer PCL.

The first electrode ELT1 may be disposed or formed on the protective layer PSV. The first electrode ELT1 may be disposed corresponding to an emission area EA of each pixel PXL. In an embodiment, the first electrode ELT1 may be an anode electrode.

The first electrode ELT1 is substantially identical or similar to the first electrode ELT1 described with reference to FIGS. 6A to 6C, and thus descriptions of the first electrode ELT1 will be omitted.

The first electrode ELT1 may contact the first terminal ET1 of the transistor T through the first contact hole CH1 exposing the first terminal ET1 of the transistor T through the protective layer PSV.

The reflection pattern RMTL may be disposed or formed on the first electrode ELT1. The reflection pattern RMTL may protrude from the first electrode ELT1 in the third direction DR3 and form a concave part CC on the first electrode ELT1. The concave part CC is a part further recessed than a top surface of the reflection pattern RMTL, and may be formed or defined by the reflection pattern RMTL and the first electrode ELT1. The reflection pattern RMTL is substantially identical or similar to the reflection pattern RMTL described with reference to FIGS. 6A to 6C, and thus repetitive descriptions will be omitted.

Although a case where the reflection pattern RMTL has a trapezoidal sectional shape is illustrated in FIGS. 7A to 7C, the reflection pattern RMTL is not limited thereto. For example, the reflection pattern RMTL may have a sectional shape such as a circular shape or an elliptical shape.

In an embodiment, the first electrode ELT1 may have an electrical conductivity (or conductivity) higher than that of the reflection pattern RMTL, and the reflection pattern RMTL may have reflexibility higher than that of the first electrode ELT1. For example, the first electrode ELT1 may be made of a low-resistance material to decrease resistance (or contact resistance), and the reflection pattern RMTL may include a material having a constant reflexibility to allow light emitted from the light emitting element LD to advance in the third direction DR3. For example, the first electrode ELT1 includes metals such as molybdenum (Mo), titanium (Ti), copper (Cu), aluminum (Al), silver (Ag), and any alloy thereof, and may include a metal (e.g., molybdenum (Mo)) having an electrical conductivity higher than that of the reflection pattern RMTL. For example, the reflection pattern RMTL includes metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and any alloy thereof, and may include a metal (e.g., aluminum (Al)) having a reflexibility higher than that of the first electrode ELT1. The reflection pattern RMTL along with the first electrode ELT1 may form an anode electrode (or an anode electrode having a multi-layered structure).

The pixel defining layer PDL may be disposed or formed on the protective layer PSV and the first electrode ELT1 in a non-emission area NEA. The pixel defining layer PDL may partially overlap an edge of the first electrode ELT1 in the non-emission area NEA. The pixel defining layer PDL is substantially identical or similar to the pixel defining layer PDL described with reference to FIGS. 6A to 6C, and thus repetitive descriptions will be omitted.

In some embodiments, the pixel defining layer PDL may further include a spacer in the non-emission area NEA. The spacer may protrude from the pixel defining layer PDL in the non-emission area NEA in the third direction DR3 and may allow a mask or the like used in a manufacturing process of the display panel DP (see FIG. 3) to be spaced apart from the pixel circuit layer PCL (or the display element layer DPL).

In an embodiment, as shown in FIG. 7A, the pixel defining layer PDL may be spaced apart from the reflection pattern RMTL. With respect to the substrate SUB (or the protective layer PSV), an inclined angle of a side surface of the pixel defining layer PDL (e.g., a side surface defining the emission area EA) may be different from that of a side surface of the reflection pattern RMTL (e.g., a side surface corresponding to the concave part CC). For example, the inclined angle of the side surface of the pixel defining layer PDL may be smaller than that of the side surface of the reflection pattern RMTL. For example, the inclined angle (or a tapered angle) of the side surface of the reflection pattern RMTL may be about 60 degrees to about 85 degrees or about 70 degrees to about 75 degrees. As described above, in case that the pixel defining layer PDL includes a light blocking material, the side surface of the pixel defining layer PDL may be relatively gently formed, and the side surface of the reflection pattern RMTL may be relatively steeply formed to guide light emitted from the light emitting element LD in the third direction DR3.

In an embodiment, as shown in FIG. 7C, the pixel defining layer PDL may overlap the reflection pattern RMTL. For example, similar to the first electrode ELT1, the reflection pattern RMTL may extend to the non-emission area NEA. The pixel defining layer PDL may be located on the reflection pattern RMTL or cover an edge of the reflection pattern RMTL in the non-emission area NEA.

The light emitting element LD may be disposed on the first electrode ELT1 in the emission area EA and be located in the concave part CC. The light emitting element LD does not overlap a protruding portion of the reflection pattern RMTL in the third direction DR3, and may be spaced apart from the side surface of the reflection pattern RMTL.

The light emitting element LD may include a second semiconductor layer 13 which contacts or is electrically connected to the first electrode ELT1, an active layer 12 disposed on the second semiconductor layer 13, and a first semiconductor layer 11 which is disposed on the active layer 12 and is electrically connected to the second electrode ELT2. The light emitting element LD may emit light while electron-hole pairs are recombined in the active layer 12. A detailed configuration (e.g., the first semiconductor layer 11, the active layer 12, and the second semiconductor layer 13) of the light emitting element LD will be described below with reference to FIG. 11.

In an embodiment, with respect to the first electrode ELT1 (the protective layer PSV or the substrate SUB), a height H1 of the top surface of the reflection pattern RMTL may be greater than that H2 of the active layer 12 of the light emitting element LD. For example, with respect to a top surface of the first electrode ELT1, the height H2 of the active layer 12 may be about 1 µm, and the height H1 of the top surface of the reflection pattern RMTL may be about 2 µm. The height H1 of the top surface of the reflection pattern RMTL may be changed according to the distance between the light emitting element LD and the reflection pattern RMTL and the inclined angle of the side surface of the reflection pattern RMTL. However, the height H1 of the top surface of the reflection pattern RMTL may be about 1.5 times the height H2 of the active layer 12 or greater, or may be greater than the height H2 of the active layer 12 by about 0.5 µm or more.

The height H1 of the top surface of the reflection pattern RMTL may be greater than that of the side surface of the pixel defining layer PDL (e.g., that of a top surface of the pixel defining layer PDL adjacent to the side surface defining emission area EA, which is about 1.8 µm), and be smaller than a total height H3 (e.g., about 3 μm to about 4 μm) of the pixel defining layer PDL including the spacer. A thickness of the reflection pattern RMTL in the third direction DR3 (e.g., the height H1 of the top surface of the reflection pattern RMTL) may be smaller than a thickness (e.g., about 3 μm to about 5 μm) of the light emitting element LD in the third direction DR3.

The insulating layer INS (or planarization layer) may be entirely provided or formed on the substrate SUB to cover the pixel defining layer PDL, the first electrode ELT1, the reflection pattern RMTL, and the light emitting element LD. The insulating layer INS may fill an empty space between the pixel defining layer PDL and the reflection pattern RMTL and/or an empty space between the reflection pattern RMTL (or the side surface of the reflection pattern RMTL) and the light emitting element LD. The insulating layer INS may prevent a side surface of the light emitting element LD from contacting the reflection pattern RMTL or another conductive material (e.g., the second electrode ELT2). The insulating layer INS may prevent an electrical short circuit between the first electrode ELT1 and the second electrode ELT2 by covering the first electrode ELT1 and the reflection pattern RMTL. To this end, the insulating layer INS may include an insulating material including an organic material.

The insulating layer INS may include a second contact hole CH2 exposing the first semiconductor layer 11 of the light emitting element LD. However, the disclosure is not limited thereto. As shown in FIG. 7B, a thickness of the insulating layer INS may be smaller than or equal to that of the light emitting element LD in the third direction DR3, and the insulating layer INS may expose the first semiconductor layer 11.

The second electrode ELT2 (or common electrode) may be provided and/or formed on the insulating layer INS (and the light emitting element LD). As shown in FIG. 7A, the second electrode ELT2 may be electrically connected to the first semiconductor layer 11 of the light emitting element LD through the second contact hole CH2. As another example, as shown in FIG. 7B, the second electrode ELT2 may directly contact the first semiconductor layer 11 of the light emitting element LD.

The second electrode ELT2 may also be provided or disposed on the pixel defining layer PDL and be entirely provided on the substrate SUB. The second electrode ELT2 may be a common layer commonly provided in the pixel PXL and pixels PXL adjacent thereto (e.g., the first to third pixels PXL1 to PXL3 shown in FIGS. 6A to 6C). In an embodiment, the second electrode ELT2 may be a cathode electrode. The second electrode ELT2 may be electrically connected to the second driving power source VSS (see FIGS. 5A and 5B) such that a voltage of the second driving power source VSS is transferred to the second electrode ELT2.

The second electrode ELT2 may be made of various transparent conductive materials (or substances) so as to allow light emitted from the light emitting element LD to advance in the third direction DR3 without loss of light. In an example, the second electrode ELT2 may include at least one of various transparent conductive materials (or substances) including indium tin oxide (ITO), indium zinc oxide (IZO), zinc oxide (ZnO), indium gallium zinc oxide (IGZO), indium tin zinc oxide (ITZO), and the like, and be substantially transparent or translucent to satisfy a predetermined transmittance (or transmittancy). However, the material of the second electrode ELT2 is not limited to the above-described embodiment.

In some embodiments, a thin-film encapsulation layer (or encapsulation layer) may be provided and/or formed on the second electrode ELT2. The thin-film encapsulation layer may include an organic insulating layer, an inorganic insulating layer, or an organic insulating layer disposed on an inorganic insulating layer. The thin-film encapsulation layer may be made of a transparent insulating material so as to minimize loss of light advancing in the third direction DR3.

As described above, the reflection pattern RMTL protrudes from the first electrode ELT1 in the emission area EA in the third direction DR3 to form the concave part CC on the first electrode ELT1, and the light emitting element LD is disposed in the concave part CC. With respect to the top surface of the first electrode ELT1, the height H1 of the reflection pattern RMTL is set to be higher than that H2 of the active layer 12 of the light emitting element LD, and the reflection pattern RMTL reflects light emitted from the active layer 12 (particularly, light emitted in an oblique direction or a horizontal direction) in the third direction DR3. Thus, light interference between adjacent pixels PXL can be prevented, and the light emission efficiency of the pixel PXL can be improved.

Since the reflection pattern RMTL is directly formed on the first electrode ELT1 before the pixel defining layer PDL is formed (or since the reflection pattern RMTL is simultaneously formed with the first electrode ELT1 by a process of forming the first electrode ELT1), an additional process (or mask) for forming the reflection pattern RMTL is not required. For example, a manufacturing process of the display panel DP (see FIG. 3) including the reflection pattern RMTL can be simplified. The manufacturing process will be described below with reference to FIGS. 12A to 12E.

Figure 8A:
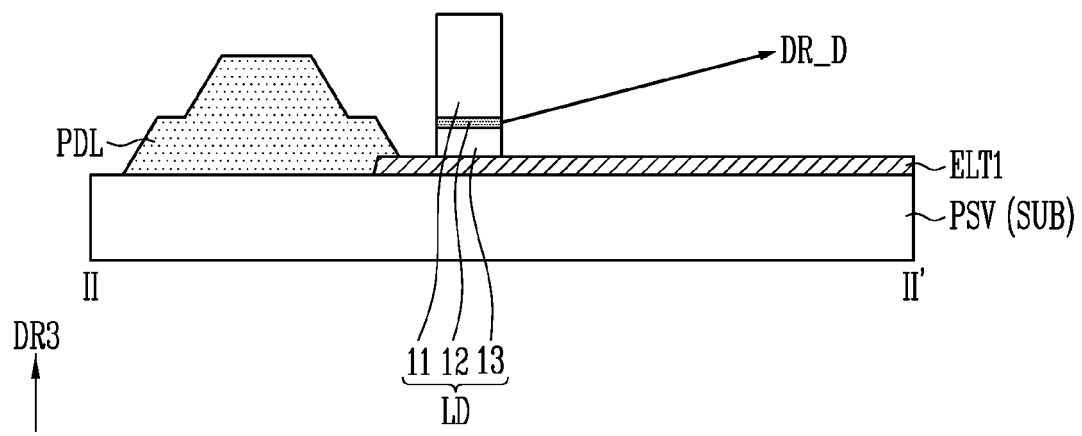
FIG. 8A is a cross-sectional view illustrating a comparative example of the pixel taken along line II-IF shown in FIG. 6A.
Figure 8B:
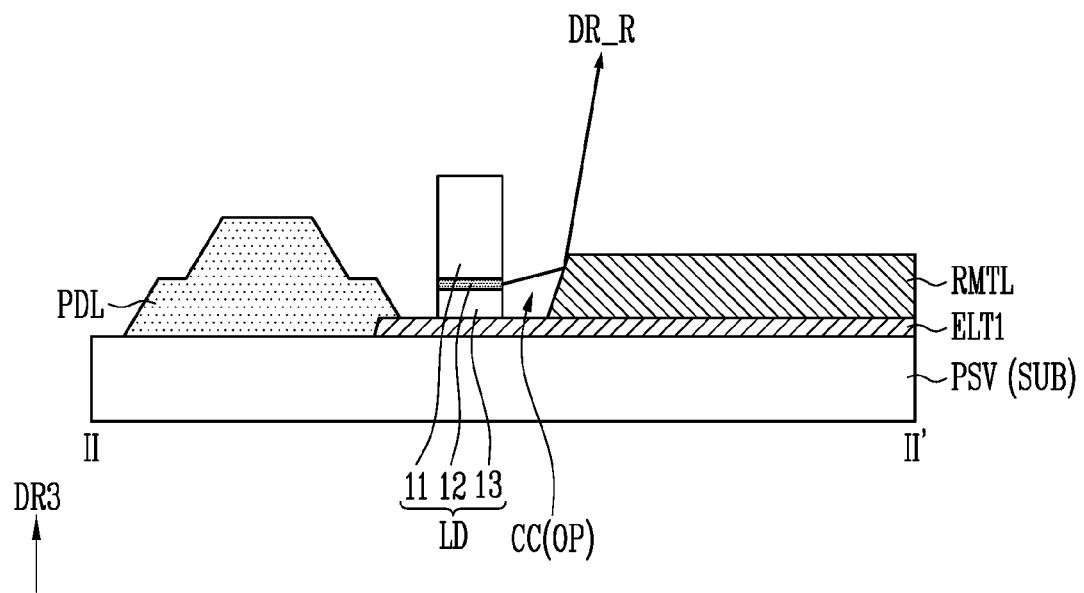
FIGS. 8B, 8C, and 8D are cross-sectional views illustrating an embodiment of the pixel taken along the line II-IF shown in FIG. 6A.
Figure 8C:
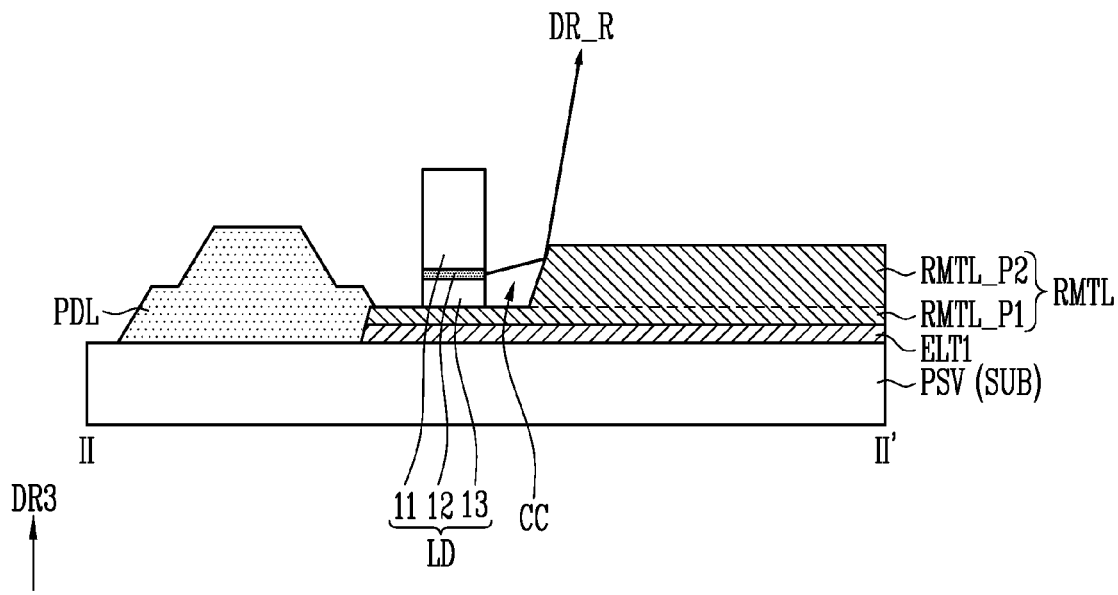
Figure 8D:
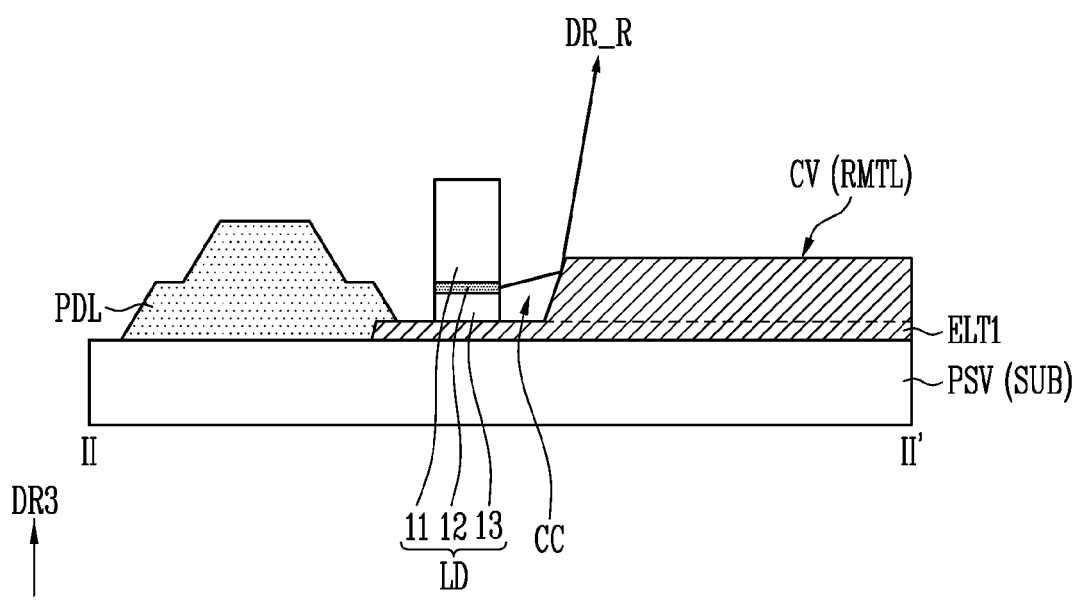

FIG. 8A is a schematic cross-sectional view illustrating a comparative example of the pixel taken along line II-IF shown in FIG. 6A. FIGS. 8B, 8C, and 8D are schematic cross-sectional views illustrating an embodiment of the pixel taken along line II-IF shown in FIG. 6A. In FIGS. 8A to 8D, for convenience of description, a pixel is briefly illustrated based on the display element layer DPL (particularly, the first electrode ELT1, the reflection pattern RMTL, the pixel defining layer PDL, and the light emitting element LD).

Referring to FIGS. 3, 6A, 7A to 7C, and 8A to 8D, the pixel PXL shown in FIGS. 8B to 8D may further include the reflection pattern RMTL, as compared with the pixel in accordance with the comparative example shown in FIG. 8A.

As shown in FIG. 8A, in case that the reflection pattern RMTL is not present, light emitted from the light emitting element LD (or the active layer 12 of the light emitting element LD) may advance in an oblique direction DR_D.

For example, in case that the light emitting element LD is disposed adjacent to the pixel defining layer PDL, a portion of the light emitted from the light emitting element LD may be blocked by the pixel defining layer PDL. For example, with respect to line II-IF shown in FIG. 6A, light which is emitted from the first light emitting element LD1 in the first pixel PXL1 and then advances in the opposite direction of the first direction DR1 may be blocked by the pixel defining layer PDL. However, in case that the reflection pattern RMTL is not present, and that the pixel defining layer PDL is spaced apart from the light emitting element LD, light which is emitted from the first light emitting element LD1 in the first pixel PXL1 and then advance in the first direction DR1 is not blocked by the pixel defining layer PDL but may advance toward even the second pixel PXL2. The second pixel PXL2 may emit light with a luminance different from a desired luminance.

As shown in FIG. 8B, in case that the reflection pattern RMTL includes an opening OP exposing the first electrode ELT1, a concave part CC may be formed or defined by the reflection pattern RMTL, the first electrode ELT1, and the pixel defining layer PDL, and the light emitting element LD may be located in the concave part CC. A portion of light emitted from the light emitting element LD (or the active layer 12 of the light emitting element LD) may be reflected in a direction DR_R corresponding to the third direction DR3 by the reflection pattern RMTL. Thus, light emitted from the first pixel PXL1 can be prevented from advancing toward the second pixel PXL2. An amount of light advancing from the first pixel PXL1 substantially in the third direction DR3 is increased by the reflection pattern RMTL, and thus the light emission efficiency of the pixel PXL can be improved.

Although a case where the opening OP exposing the first electrode ELT1 is formed in the reflection pattern RMTL has been described in FIG. 8B, the disclosure is not limited thereto.

As shown in FIG. 8C, the reflection pattern RMTL may include a first part RMTL P1 completely overlapping the first electrode ELT1 and a second part RMTL P2 protruding from the first part RMTL P1 in the third direction DR3. For example, the reflection pattern RMTL may include the concave part CC instead of the opening OP. The pixel defining layer PDL may partially cover the reflection pattern RMTL. The light emitting element LD (or the second semiconductor layer 13 of the light emitting element LD) may directly contact the reflection pattern RMTL. The reflection pattern RMTL may be a bonding metal bonded to the light emitting element LD. For example, the reflection pattern RMTL may include copper (Cu).

Although will be described below with reference to FIGS. 12A to 12E, the first electrode ELT1 and the reflection pattern RMTL may be collectively patterned (or collectively etched) by using a mask (e.g., a halftone mask), and a portion of the reflection pattern RMTL may be etched according to the thickness, etching time, etc. of the reflection pattern RMTL. The first part RMTL P1 of the reflection pattern RMTL may be formed. As another example, the first electrode ELT1 may be partially etched such that a concave portion is formed in the first electrode ELT1.

In an embodiment, as shown in FIG. 8D, the first electrode ELT1 and the reflection pattern RMTL may be integral with each other. For example, the first electrode ELT1 and the reflection pattern RMTL may include the same material. The reflection pattern RMTL may a convex part CV (e.g., a portion convex in the third direction DR3) of the first electrode ELT1, and the concave part CC may be defined or formed by the first electrode ELT1.

The first electrode ELT1 and the reflection pattern RMTL, which are described with reference to FIGS. 8B to 8D, may be applied to the embodiments shown in FIGS. 6A to 6C and 7A to 7C.

Figure 9A:
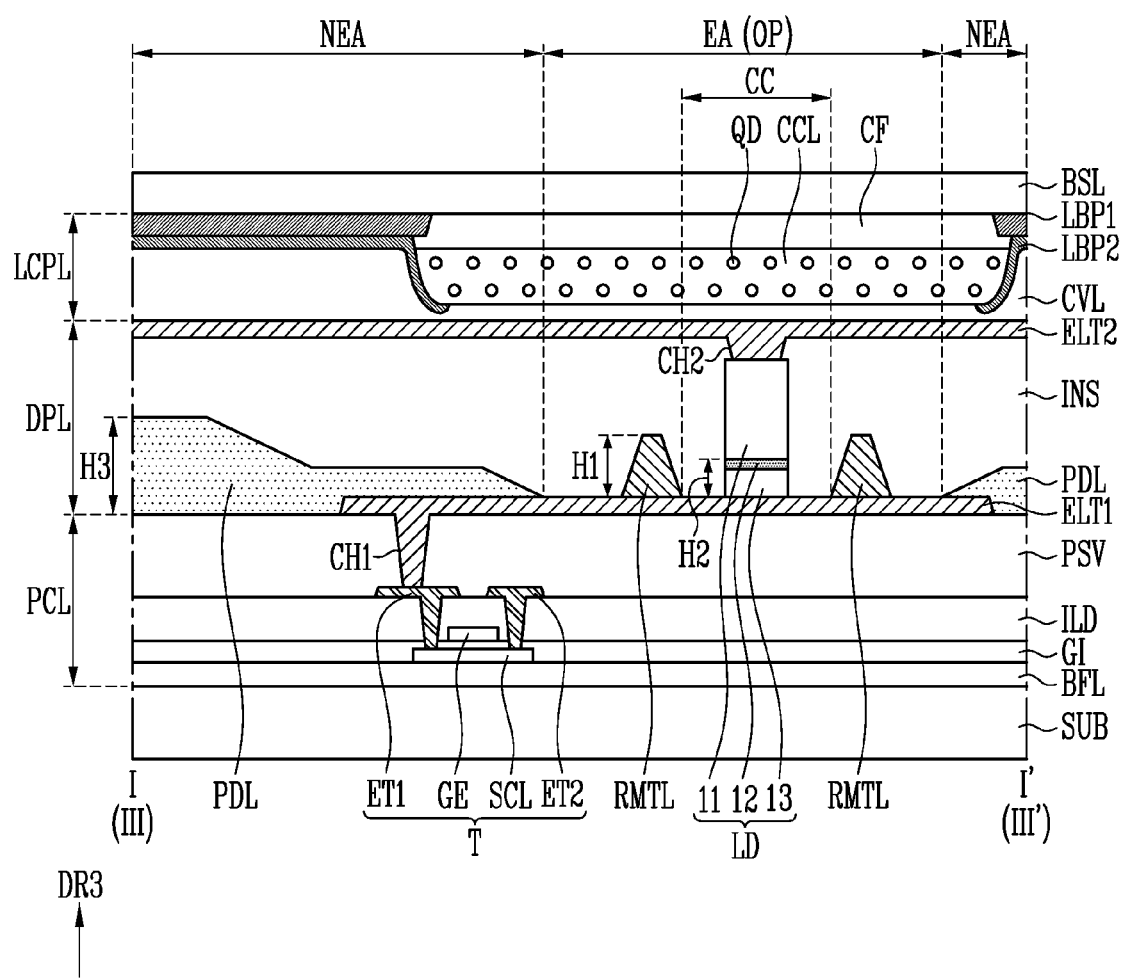
FIGS. 9A and 9B are cross-sectional views illustrating another embodiment of the pixel taken along the line I-I' shown in FIG. 6A.
Figure 9B:
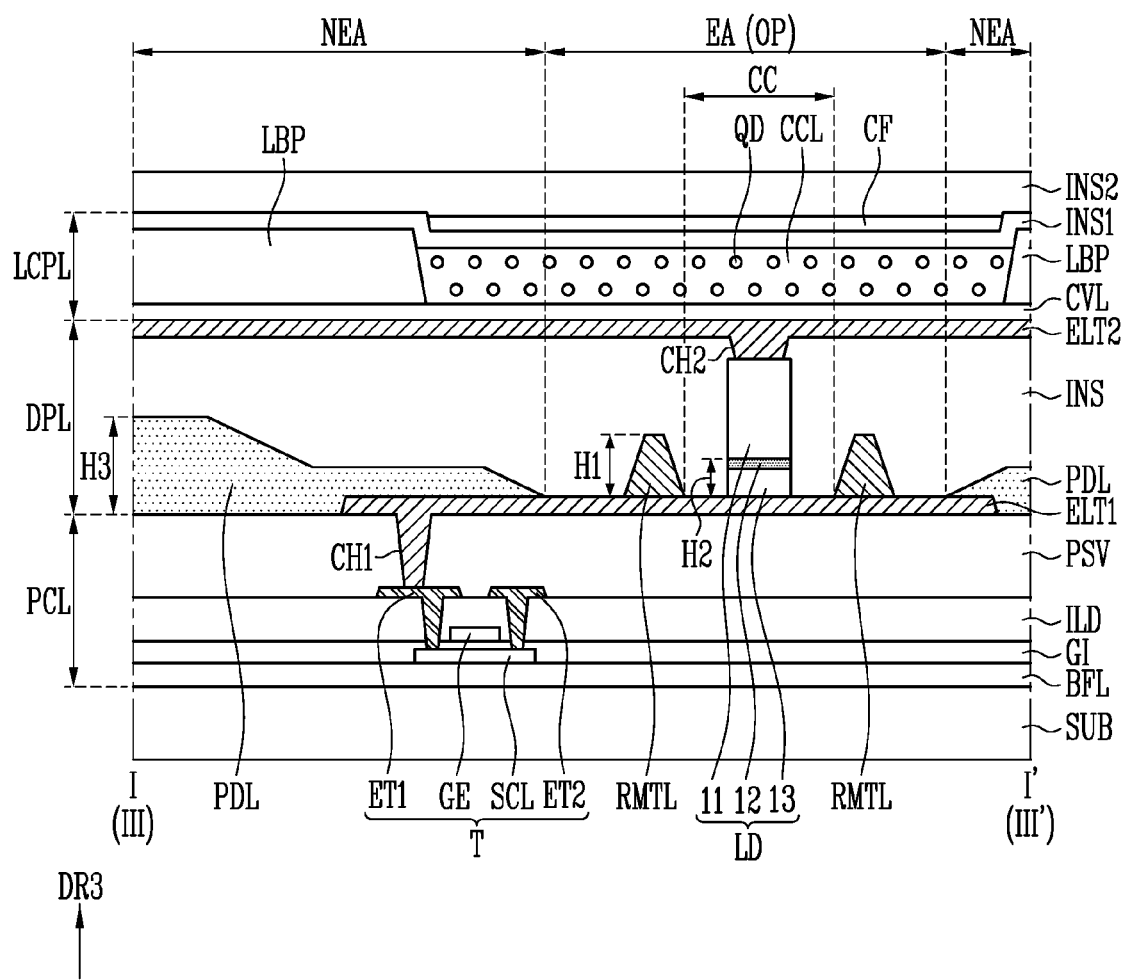

FIGS. 9A and 9B are schematic cross-sectional views illustrating an embodiment of the pixel taken along line I-I' shown in FIG. 6A. FIGS. 9A and 9B correspond to FIG. 7A.

Referring to FIGS. 4A, 4B, 6A, 7A, 9A, and 9B, a light conversion pattern layer LCPL (or upper substrate) may be disposed on a display element layer DPL. The light conversion pattern layer LCPL may be the window WD (see FIG. 2) of the display device DD (see FIG. 2). A substrate SUB, a pixel circuit layer PCL, and the display element layer DPL are substantially identical or similar to the substrate SUB, the pixel circuit layer PCL, and the display element layer DPL, which are described with reference to FIGS. 7A to 7C, respectively, and therefore, repetitive descriptions will be omitted.

Embodiments shown in FIGS. 9A and 9B represent different embodiments in relation to the position, formation order, and/or shape of the light conversion pattern layer LCPL. Therefore, as illustrated in FIGS. 9A and 9B, components different from those of the above-described embodiments will be mainly described to avoid redundancy.

First, referring to FIG. 9A, the light conversion pattern layer LCPL may include a cover layer CVL. The cover layer CVL may entirely cover an emission area EA and a non-emission area NEA to block moisture or humidity from being introduced into a light emitting element LD from the outside. The cover layer CVL may have a structure in which at least one inorganic insulating layer or at least one organic insulating layer are alternately stacked.

In some embodiments, the cover layer CVL may be a transparent adhesive layer (or cohesive layer), e.g., an optically clear adhesive (OCA) for reinforcing adhesion between the light conversion pattern layer LCPL and the display element layer DPL, but the disclosure is not limited thereto. In other embodiments, the cover layer CVL may be a refractive index conversion layer for improving light emission luminance of the pixel PXL (see FIG. 6A) by converting the refractive index of light which is emitted from the light emitting element LD and then advances toward the light conversion pattern layer LCPL. In still other embodiments, the cover layer CVL may be made of (or include) a thermosetting resin and/or a photocurable resin and may be coated on the display element layer DPL in liquid form and then cured by a curing process using heat and/or light.

The light conversion pattern layer LCPL may include a light conversion pattern and a base layer BSL, and the light conversion pattern may include a color conversion layer CCL and a color filter CF.

The base layer BSL may be a rigid substrate or a flexible substrate, and the material or property of the base layer BSL is not particularly limited. The base layer BSL and the substrate SUB may be made of the same material, or different materials.

The light conversion pattern may be disposed on a surface of the base layer BSL to face a corresponding display element layer DPL.

The color conversion layer CCL may include color conversion particles QD corresponding to a specific color. The color filter CF may selectively transmit light of a specific color.

The color conversion particles QD may be disposed on a surface of the base layer BSL to face the light emitting element LD, and may convert light emitted from the light emitting element LD into light of a specific color. In an example, in case that the pixel PXL is a red pixel, the color conversion layer CCL may include color conversion particles QD formed of a red quantum dot for converting light (or light of a first color) emitted from the light emitting element LD into light of red (or light of a second color). In case that the pixel PXL is a green pixel, the color conversion layer CCL may include color conversion particles QD formed of a green quantum dot for converting light (or light of a first color) emitted from the light emitting elements LD into light of green (or light of a second color). In case that the pixel PXL is a blue pixel, the color conversion layer CCL may include color conversion particles QD formed of a blue quantum dot for converting light (or light of a first color) emitted from the light emitting elements LD into light of blue (or light of a second color). In some embodiments, the pixel PXL may include a light scattering layer including light scattering particles instead of the color conversion layer CCL including the color conversion particles QD. In an embodiment, in case that the light emitting element LD emits blue series light, the pixel PXL may include a light scattering layer including light scattering particles. In some embodiments, the above-described light scattering layer may be omitted. In other embodiments, the pixel PXL may include transparent polymer instead of the color conversion layer CCL.

The color filter CF is disposed on a surface of the color conversion layer CCL of the pixel PXL and may include a color filter material for allowing light of a specific color converted in the color conversion layer CCL to be selectively transmitted therethrough. In case that the pixel PXL is a red pixel, the color filter CF may include a red color filter. In case that the pixel PXL is a green pixel, the color filter CF may include a green color filter. In case that the pixel PXL is a blue pixel, the color filter CF may include a blue color filter.

The light conversion pattern including the color conversion layer CCL and the color filter CF may be located in the emission area EA of the pixel PXL.

A first light blocking pattern LBP1 may be located adjacent to the light conversion pattern. The first light blocking pattern LBP1 may be provided on the surface of the base layer BSL to overlap components located in the non-emission area NEA, e.g., the pixel circuit including the transistor T. The first light blocking pattern LBP1 may include at least one black matrix material (e.g., at least one light blocking material) among various kinds of black matrix materials, and/or a color filter material of a specific color.

In some embodiments, the first light blocking pattern LBP1 may be provided in the form of a multi-layer in which at least two color filters which allow lights of different colors to be selectively transmitted therethrough among a red color filter, a green color filter, and a blue color filter overlap each other. In an example, the first light blocking pattern LBP1 may include a red color filter, a green color filter which is located on the red color filter and overlaps the red color filter, and a blue color filter which is located on the green color filter and overlaps the green color filter. For example, the first light blocking pattern LBP1 may be provided in the form of a structure in which a red color filter, a green color filter, and a blue color filter are sequentially stacked. The red color filter, the green color filter, and the blue color filter may be used as the first light blocking pattern LBP1 which blocks transmission of light in the non-emission area NEA.

In some embodiments, a second light blocking pattern LBP2 may be disposed on the first light blocking pattern LBP1. The first light blocking pattern LBP1 and the second light blocking pattern LBP2 may include the same material. In an example, the first light blocking pattern LBP1 and the second light blocking pattern LBP2 may be a black matrix.

Next, referring to FIG. 9B, a light blocking pattern LBP may be provided on the cover layer CVL.

The light blocking pattern LBP may include a light blocking material which prevents a light leakage failure in which light (or beam) is leaked between the pixel PXL and pixels PXL adjacent thereto. The light blocking pattern LBP may be a black matrix. The light blocking pattern LBP may prevent mixture of beams of light emitted from the respective adjacent pixels PXL. In some embodiments, the light blocking pattern LBP may include at least one light blocking material and/or at least one reflective material, to allow light emitted from a light emitting element LD located in the emission area EA to further advance in an image display direction of the display device DD (shown in FIG. 2), thereby improving the light emission efficiency of the light emitting element LD.

The above-described light blocking pattern LBP may be provided in the non-emission area NEA except the emission area EA. The light blocking pattern LBP may be a dam structure which is located on the cover layer CVL to define the emission area EA in which a color conversion layer CCL is to be supplied (or input). In an example, the emission area EA of the pixel PXL is defined by the light blocking pattern LBP, so that the color conversion layer CCL including a desired amount and/or a desired kind of color conversion particles QD can be supplied (or input).

The color conversion layer CCL may fill a space surrounded by the light blocking pattern LBP.

A first insulating layer INS1 may be entirely provided and/or formed on the color conversion layer CCL and the light blocking pattern LBP.

The first insulating layer INS1 may be a protective layer covering components located thereunder, e.g., the color conversion layer CCL and the light blocking pattern LBP. The first insulating layer INS1 may be an inorganic insulating layer including an inorganic material or an organic insulating layer including an organic material, but the material of the first insulating layer INS1 is not limited to the above-described embodiments. In some embodiments, the first insulating layer INS1 may be omitted.

A color filter CF may be provided on a surface of the first insulating layer INS1 to overlap (or correspond to) the color conversion layer CCL. The color filter CF may be located on the color conversion layer CCL with the first insulating layer INS1 interposed therebetween to allow light of a specific color converted in the color conversion layer CCL to be selectively transmitted in the image display direction of the display device DD therethrough.

A second insulating layer INS2 may be entirely provided and/or formed on the color filter CF and the first insulating layer INS1. The second insulating layer INS2 may be an inorganic insulating layer including an inorganic material or an organic insulating layer including an organic material. In some embodiments, the second insulating layer INS2 may be a planarization layer which reduces a step difference caused by components disposed thereunder.

As described above, the pixel PXL further includes the light conversion pattern layer LCPL disposed on the light emitting element LD, and emits light having an excellent color reproducibility through the light conversion pattern layer LCPL, so that the light emission efficiency of the pixel PXL can be improved.

Figure 10:
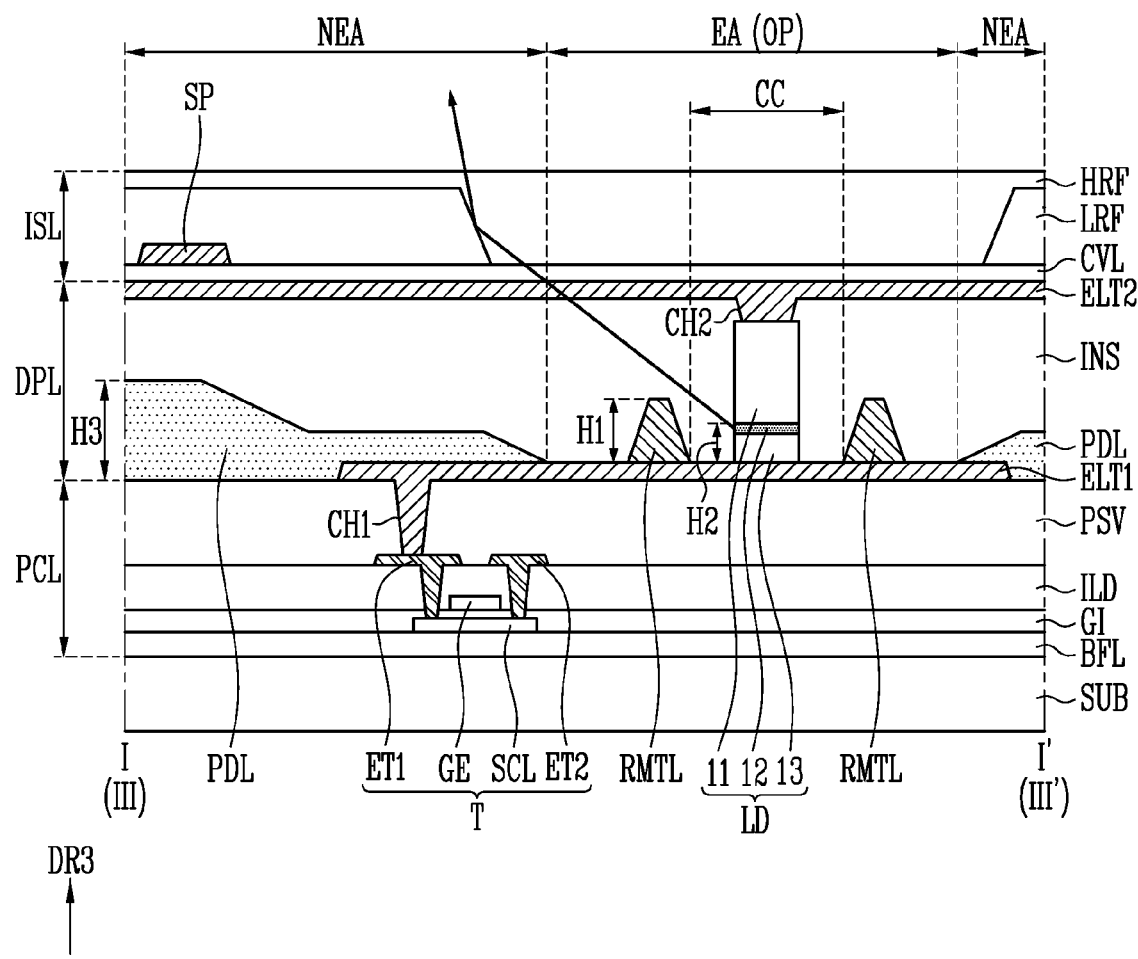
FIG. 10 is a cross-sectional view illustrating still another embodiment of the pixel taken along the line I-I' shown in FIG. 6A.

FIG. 10 is a schematic cross-sectional view illustrating an embodiment of the pixel taken along line I-I' shown in FIG. 6A. FIG. 10 corresponds to FIG. 7A.

Referring to FIGS. 4A, 4C, 6A, 7A, and 10, an input sensing layer ISL may be disposed on a display element layer DPL. A substrate SUB, a pixel circuit layer PCL, and the display element layer DPL are substantially identical or similar to the substrate SUB, the pixel circuit layer PCL, and the display element layer DPL, which are described with reference to FIGS. 7A to 7C, respectively, and therefore, repetitive descriptions will be omitted.

The input sensing layer ISL may include a cover layer CVL, a sensor electrode SP, a first refractive layer LRF (or low refractive index planarization layer), and a second refractive layer HRF (or high refractive index planarization layer).

The cover layer CVL may entirely cover (or overlap) an emission area EA and a non-emission area NEA to block moisture or humidity from being introduced into a light emitting element LD from the outside.

The sensor electrode SP may be disposed on the cover layer CVL in the non-emission area NEA. The sensor electrode SP may have a single-layered structure or have a multi-layered structure in which layers are stacked in the third direction DR3.

The sensor electrode SP having the single-layered structure may include a metal layer or a transparent conductive layer. The metal layer may include molybdenum, silver, titanium, copper, aluminum, and any alloy thereof. The transparent conductive layer may include a transparent conductive oxide such as indium tin oxide (ITO), indium zinc oxide (IZO), zinc oxide (ZnO), or indium tin zinc oxide (ITZO). The transparent conductive layer may include conductive polymer such as PEDOT, metal nanowire, graphene, etc.

The sensor electrode SP having the multi-layered structure may include metal layers. The metal layers may have, for example, a triple structure of titanium/aluminum/titanium. The sensor electrode SP having the multi-layered structure may include at least one metal layer and at least one transparent conductive layer.

The sensor electrode SP may have a mesh pattern (or mesh structure) in a plan view. In case that the sensor electrode SP is directly disposed as the mesh pattern on the display element layer DPL, the flexibility of the display device DD (see FIG. 1) can be improved. In case that the sensor electrode SP implemented as the mesh pattern is disposed in the non-emission area NEA, the blocking of light emitted in the emission area EA by the sensor electrode SP is minimized, and the sensor electrode SP can be prevented from being visually recognized by a user.

The first refractive layer LRF may be disposed on the sensor electrode SP and the cover layer CVL in the non-emission area NEA and cover the sensor electrode SP.

The first refractive layer LRF may include a hole exposing the cover layer CVL in the emission area EA. The hole formed in the first refractive layer LRF may correspond to the emission area EA. In a plan view, a size of the hole may be greater than that of the emission area EA and be smaller than that of a mesh hole (e.g., a hole included in the mesh pattern) of the sensor electrode SP.

The first refractive layer LRF may have a side surface inclined with respect to an upper surface of the cover layer CVL. The side surface of the first refractive layer LRF may form a total reflection surface, in relation to the second refractive layer HRF.

The first refractive layer LRF may include an organic material. For example, the first refractive layer LRF may be formed as a single layer including an organic material such as acryl resin, epoxy resin, phenolic resin, polyamide resin, or polyimide resin. However, the disclosure is not limited thereto. For example, the first refractive layer LRF may be formed as an acrylic transparent organic layer.

The second refractive layer HRF may be directly disposed on the first refractive layer LRF and the cover layer CVL. The second refractive layer HRF may be entirely disposed on the cover layer CVL.

The second refractive layer HRF may have a refractive index higher than that of the first refractive layer LRF.

The second refractive layer HRF may include an organic material. For example, the second refractive layer HRF may be formed as a single layer including an organic material such as acryl resin, epoxy resin, phenolic resin, polyamide resin, or polyimide resin. However, the second refractive layer HRF is not limited thereto as long as it includes an organic material having a refractive index higher than that of the first refractive layer LRF.

Some of beams of light emitted from the light emitting element LD may be transmitted through the cover layer CVL and the second refractive layer HRF and then may be incident onto the side surface of the first refractive layer LRF. The beams of light may be reflected (or totally reflected) by the side surface of the first refractive layer LRF in a direction corresponding to the third direction DR3 because of a difference in refractive index (or refractive index ratio) between the second refractive layer HRF and the first refractive layer LRF. Thus, the light emission efficiency of the pixel PXL can be improved.

The difference in refractive index between the second refractive layer HRF and the first refractive layer LRF may be about 0.2 to about 0.4. For example, the refractive index of the second refractive layer HRF may be higher than that of the first refractive layer LRF by about 0.2 to about 0.4. For example, the refractive index of the first refractive layer LRF may be in a range of about 1.3 to about 1.6 or about 1.5, and the refractive index of the second refractive layer HRF may be in a range of about 1.5 or higher, about 1.6 to about 1.9, or about 1.8.

The inclined angle (or tapered angle) of the side surface of the first refractive layer LRF may be in a range of about 60 degrees to about 85 degrees, or about 70 degrees to about 75 degrees. In an embodiment, a thickness of the first refractive layer LRF in the third direction DR3 may be in a range of about 1 µm to about 3 about 1.5 µm to about 2.5 or about 1.8 µm to about 2 µm.

As described above, the input sensing layer ISL is disposed on the display element layer DPL to sense a contact or an input, which is caused by an external medium such as a finger or a pen. A light path control structure implemented by the first refractive layer LRF and the second refractive layer HRF is formed in the input sensing layer ISL, so that the light emission efficiency of the pixel PXL (see FIG. 6A) can be further improved.

Figure 11:
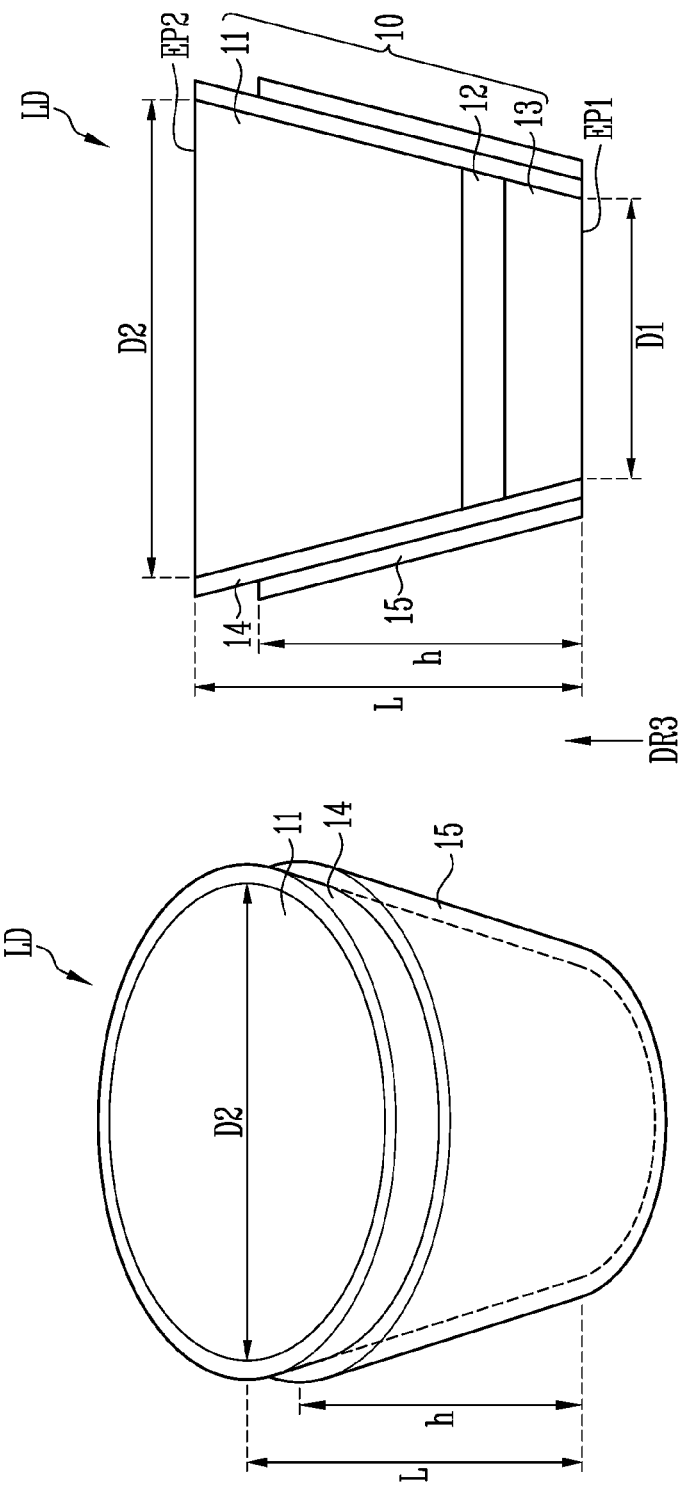
FIG. 11 is a view schematically illustrating a light emitting element in accordance with an embodiment of the disclosure.

FIG. 11 is a view schematically illustrating a light emitting element in accordance with an embodiment.

Referring to FIG. 11, the light emitting element LD may include a first semiconductor layer 11, a second semiconductor layer 13, and an active layer 12 interposed between the first and second semiconductor layers 11 and 13. In an example, the light emitting element LD may implement a light emitting stack structure 10 in which the second semiconductor layer 13, the active layer 12, and the first semiconductor layer 11 are sequentially stacked.

The light emitting element LD may extend in a direction. In case that assuming that an extending direction of the light emitting element LD is a length direction, the light emitting element LD may include a first end portion EP1 (or lower end portion) and a second end portion EP2 (or upper end portion) in the extending direction. In an embodiment, the length direction may be parallel to the third direction DR3. Any of the first semiconductor layer 11 and the second semiconductor layer 13 may be located at the first end portion EP1 (or lower end portion) of the light emitting element LD, and the other of the first semiconductor layer 11 and the second semiconductor layer 13 may be located at the second end portion EP2 (or upper end portion) of the light emitting element LD. In an example, the second semiconductor layer 13 may be located at the first end portion EP1 (or lower end portion) of the light emitting element LD, and the first semiconductor layer 11 may be located at the second end portion EP2 (or upper end portion) of the light emitting element LD.

The light emitting element LD may be provided in various shapes. In an example, the light emitting element LD may have a rod-like shape, a bar-like shape, or a pillar shape, which is long in a length direction (e.g., having an aspect ratio greater than 1). The light emitting element LD may have a rod-like shape, a bar-like shape, or a pillar shape, which is short in a length direction (e.g., having an aspect ratio is smaller than 1).

In an embodiment, the light emitting element LD may have a pillar shape in which a diameter D1 of the first end portion EP1 and a diameter D2 of the second end portion EP2 are different from each other. In an example, the light emitting element LD may have a pillar shape in which the diameter D1 of the first end portion EP1 is smaller than the diameter D2 of the second end portion EP2. The light emitting element LD may have an elliptical pillar shape of which the diameter increases toward the top thereof in the third direction DR3.

The length L of the light emitting element LD in the length direction may be greater or smaller than the diameter D1 (e.g., the width of a first cross-section) of the first end portion EP1 and the diameter D2 (e.g., the width of a second cross-section) of the second end portion EP2. In an example, the length L of the light emitting element LD may be greater than the diameter D1 of the first end portion EP1 and be smaller than the diameter D2 of the second end portion EP2. However, the disclosure is not limited thereto. In some embodiments, the length L of the light emitting element LD may be equal to the diameter D1 of the first end portion EP1 and may be equal to the diameter D2 of the second end portion EP2. The above-described light emitting element LD may include, for example, a light emitting diode (LED) manufactured small enough to have a diameter and/or a length L to a degree of nanometer scale to micrometer scale.

The size of the light emitting element LD may be variously changed to be suitable for requirements (or design conditions) of a lighting device or a self-luminescent display device, to which the light emitting element LD is applied.

The second semiconductor layer 13 may include, for example, at least one p-type semiconductor layer. In an example, the second semiconductor layer 13 may include at least one semiconductor material among InAlGaN, GaN, AlGaN, InGaN, AlN, and InN and include a p-type semiconductor layer doped with a second conductivity type dopant (or p-type dopant) such as Mg, Zn, Ca, Sr or Ba. However, the material forming the second semiconductor layer 13 is not limited thereto. The second semiconductor layer 13 may be formed of various materials. In an embodiment, the second semiconductor layer 13 may include a gallium nitride (GaN) semiconductor material doped with a second conductivity type dopant (or p-type dopant). The second semiconductor layer 13 may include an upper surface contacting the active layer 12 in the length direction of the light emitting element LD and a lower surface exposed to the outside.

The active layer 12 is disposed on the second semiconductor layer 13 and may be formed as a single-quantum well structure or a multi-quantum well structure. In an example, in case that the active layer 12 is formed as the multi-quantum well structure, a barrier layer (not shown), a strain reinforcing layer (not shown), and a well layer (not shown), which form a unit, may be periodically and repeatedly stacked in the active layer 12. The strain reinforcing layer may have a lattice constant smaller than that of the barrier layer to further reinforce strain, e.g., compressive strain applied to the well layer. However, the structure of the active layer 12 is not limited to the above-described embodiment.

The active layer 12 may emit light having a wavelength of about 400 nm to about 900 nm and have a double hetero structure. In an embodiment, a clad layer (not shown) doped with a conductivity type dopant may be formed on the top and/or bottom of the active layer 12 in the length direction of the light emitting element LD. In an example, the clad layer may be formed as an AlGaN layer or InAlGaN layer. In some embodiments, a material such as AlGaN or InAlGaN may be used to form the active layer 12. The active layer 12 may be configured with various materials. The active layer 12 may include a first surface contacting the second semiconductor layer 13 and a second surface contacting the first semiconductor layer 11.

In case that a corresponding signal (or voltage) is applied to each of the first end portion EP1 and the second end portion EP2 of the light emitting element LD, the light emitting element LD emits light as electron-hole pairs are recombined in the active layer 12. The light emission of the light emitting element LD is controlled by using such a principle, so that the light emitting element LD can be used as a light source (or light emitting source) for various light emitting devices, including a pixel of a display device.

The first semiconductor layer 11 is disposed on the active layer 12 and may include a semiconductor layer having a type different from that of the second semiconductor layer 13. In an example, the first semiconductor layer 11 may include at least one n-type semiconductor layer. For example, the first semiconductor layer 11 may include any semiconductor material among InAlGaN, GaN, AlGaN, InGaN, AlN, and InN and may be an n-type semiconductor layer doped with a first conductivity type dopant (or n-type dopant) such as Si, Ge or Sn. However, the material forming the first semiconductor layer 11 is not limited thereto. The first semiconductor layer 11 may be configured with various materials. In an embodiment, the first semiconductor layer 11 may include a gallium nitride (GaN) semiconductor material doped with a first conductivity type dopant (or n-type dopant). The first semiconductor layer 11 may include a lower surface contacting the active layer 12 in the length direction of the light emitting element LD and an upper surface exposed to the outside. The upper surface of the first semiconductor layer 11 may be the second end portion EP2 (or upper end portion) of the light emitting element LD.

In an embodiment, the second semiconductor layer 13 and the first semiconductor layer 11 may have different thicknesses in the length direction of the light emitting element LD (or the third direction DR3). In an example, the first semiconductor layer 11 may have a thickness relatively greater than that of the second semiconductor layer 13 in the length direction of the light emitting element LD (or the third direction DR3). Accordingly, the active layer 12 of the light emitting element LD may be located more adjacent to the lower surface of the second semiconductor layer 13 than the upper surface of the first semiconductor layer 11.

Although FIG. 11 illustrates that each of the first semiconductor layer 11 and the second semiconductor layer 13 is configured with one layer, the disclosure is not limited thereto. In an embodiment, each of the first semiconductor layer 11 and the second semiconductor layer 13 may further include at least one layer, e.g., a clad layer and/or a tensile strain barrier reducing (TSBR) layer according to the material of the active layer 12. The TSBR layer may be a strain reducing layer disposed between semiconductor layers having different lattice structures to perform a buffering function for reducing a lattice constant difference. The TSBR layer may be configured with a p-type semiconductor layer such as a p-GAInP, p-AlInP or p-AlGaInP layer, but the disclosure is not limited thereto.

In some embodiments, the light emitting element LD may further include an additional electrode (not shown) (hereinafter referred to as a "first additional electrode") disposed on the bottom of the second semiconductor layer 13, in addition to the first semiconductor layer 11, the active layer 12, and the second semiconductor layer 13, which are described above. In other embodiments, the light emitting element LD may further include another additional electrode (not shown) (hereinafter referred to as a "second additional electrode") disposed on the top of the first semiconductor layer 11.

Each of the first and second additional electrodes may be an ohmic contact electrode, but the disclosure is not limited thereto. In some embodiments, each of the first and second additional electrodes may be a Schottky contact electrode. The first and second additional electrodes may include a conductive material. For example, the first and second additional electrodes may include an opaque metal using one or mixture of chromium (Cr), titanium (Ti), aluminum (Al), gold (Au), nickel (Ni), and any alloy thereof, but the disclosure is not limited thereto. In some embodiments, the first and second additional electrodes may include a transparent conductive oxide such as indium tin oxide (ITO), indium zinc oxide (IZO), zinc oxide (ZnO), indium gallium zinc oxide (IGZO), or indium tin zinc oxide (ITZO).

Materials respectively included in the first and second additional electrodes may be identical to or different from each other. The first and second additional electrodes may be substantially transparent or translucent. Accordingly, light generated in the light emitting element LD can be emitted to the outside of the light emitting element LD by passing through the first and second additional electrodes. In some embodiments, in case that light generated by the light emitting element LD does not pass through the first and second additional electrodes and is emitted to the outside of the light emitting element LD through an area except both the end portions EP1 and EP2 of the light emitting element LD, the first and second additional electrodes may include an opaque metal.

In an embodiment, the light emitting element LD may further include an insulative film 14. However, in some embodiments, the insulative film 14 may be omitted or be provided to cover a portion of the light emitting stack structure 10.

The insulative film 14 can prevent an electrical short circuit that may occur in case that the active layer 12 contacts a conductive material except the first semiconductor layer 11 and the second semiconductor layer 13. The insulative film 14 minimizes a surface defect of the light emitting element LD, thereby improving the lifespan and light emission efficiency of the light emitting element LD. In case that light emitting elements LD are densely disposed, the insulative film 14 can prevent an unwanted short circuit that may occur between the light emitting elements LD. Whether the insulative film 14 is to be provided is not limited as long as the active layer 12 can be prevented from being short-circuited with an external conductive material.

The insulative film 14 may entirely surround an outer circumferential surface of the light emitting stack structure 10 including the second semiconductor layer 13, the active layer 12, and the first semiconductor layer 11.

In the above-described embodiment, it has been described that the insulative film 14 entirely surrounds an outer circumferential surface of each of the second semiconductor layer 13, the active layer 12, and the first semiconductor layer 11. However, the disclosure is not limited thereto. In some embodiments, in case that the light emitting element LD includes the first additional electrode, the insulative film 14 may entirely surround an outer circumferential surface of each of the first additional electrode, the second semiconductor layer 13, the active layer 12, and the first semiconductor layer 11. In other embodiments, the insulative film 14 may not entirely surround the outer circumferential surface of the first additional electrode. As another example, the insulative film 14 may surround only a portion of the outer circumferential surface of the first additional electrode and may not surround the other of the outer circumferential surface of the first additional electrode. In some embodiments, in case that the first additional electrode is disposed at the first end portion EP1 (or lower end portion) of the light emitting element LD, and the second additional electrode is disposed at the second end portion EP2 (or upper end portion) of the light emitting element LD, the insulative film 14 may expose at least one area of each of the first and second additional electrodes.

The insulative film 14 may include a transparent insulating material. For example, the insulative film 14 may include at least one insulating material selected from the group consisting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanium-strontium oxide ($SrTiO_x$), cobalt oxide ($Co_xO_y$), magnesium oxide (MgO), zinc oxide (ZnO), ruthenium oxide ($RuO_x$), nickel oxide (NiO), tungsten oxide ($WO_x$), tantalum oxide ($TnO_x$), gadolinium oxide ($GdO_x$), zirconium oxide ($ZrO_x$), gallium oxide ($GaO_x$), vanadium oxide ($V_xO_y$), ZnO:Al, ZnO:B, $In_xO_y$:H, niobium oxide ($Nb_xO_y$), magnesium fluoride ($MgF_x$), aluminum fluoride ($AlF_x$), alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), vanadium nitride (VN), and the like. However, the disclosure is not limited thereto, and various materials having insulating properties may be used as the material of the insulative film 14.

The insulative film 14 may be provided in the form of a single layer or be provided in the form of a multi-layer including at least two layers. In an example, in case that the insulative film 14 may be configured as a double layer including a first layer and a second layer which are sequentially stacked, the first layer and the second layer may be made of (or include) different materials (or ingredients) and be formed by different processes. In some embodiments, the first layer and the second layers may include the same material.

The light emitting element LD may further include a reflection member 15 surrounding an outer circumferential surface of the insulative film 14.

The reflection member 15 may be made of a material having a predetermined reflexibility to allow light emitted from the light emitting element LD to be concentrated on a specific area while allowing the light emitted from the light emitting element LD to advance in the image display direction. In an example, the reflection member 15 may be made of a conductive material (or substance) having a predetermined reflexibility. The reflection member 15 may include an opaque metal. The reflection member 15 and the reflection pattern RMTL or the first electrode ELT1 may include the same material, or the reflection member 15 may include at least one material selected from the materials exemplified as the material constituting the first electrode ELT1.

In an embodiment, the reflection member 15 may have a slope constant in an oblique direction, which is inclined with respect to the third direction DR3, so as to collimate light emitted from the active layer 12 of the light emitting element LD toward a specific area. As described above, since the light emitting element LD has an elliptical pillar shape, the diameter of which increases toward the top thereof in the length direction (or the third direction DR3), the insulative film 14 surrounding the outer circumferential surface of the light emitting stack structure 10 and the reflection member 15 surrounding the outer circumferential surface of the insulative film 14 may have a constant slope when viewed on a plane or in a plan view. In case that the reflection member 15 has a constant slope, light emitted from the active layer 12 of the light emitting element LD may be reflected by the reflection member 15 to be concentrated on a specific area. For example, the reflection member 15 may concentrate light emitted radially (or in a radial shape) from the active layer 12 of the light emitting element LD on a specific area.

The above-described reflection member 15 may partially surround the outer circumferential surface of the insulative film 14 to expose a portion of the insulative film 14. A height h of the reflection member 15 in the third direction DR3 may be smaller than the length L of the light emitting element LD. An end portion (or lower end portion) of the reflection member 15 and the first end portion EP1 of the light emitting element LD may be located on the same line (or the same surface), and the other end portion (or upper end portion) of the reflection member 15 may be located lower than the second end portion EP2 of the light emitting element LD in the third direction DR3.

In the light emitting element LD, the second semiconductor layer 13 and the first semiconductor layer 11, which are implemented as different types of semiconductor layers, may be located to face each other in the length direction of the corresponding light emitting element LD (or the third direction DR3). The second semiconductor layer 13 may be located at the first end portion EP1 (or lower end portion) of the light emitting element LD, and the first semiconductor layer 11 may be located at the second end portion EP2 (or upper end portion) of the light emitting element LD. The light emitting element LD may be a light emitting element having a vertical structure in which the second semiconductor layer 13, the active layer 12, and the first semiconductor layer 11 are sequentially stacked in the length direction of the corresponding light emitting element LD (or the third direction DR3).

The above-described light emitting element LD may be used as a light emitting source (or light source) of various display devices.

FIGS. 12A to 12E are cross-sectional views sequentially illustrating a manufacturing method of the pixel shown in FIG. 7A. In FIGS. 12A to 12E, for convenience of description, a pixel PXL is briefly illustrated based on the display element layer DPL (see FIG. 7A).

Hereinafter, a manufacturing method of the pixel PXL in accordance with the embodiment shown in FIG. 7A is sequentially described with reference to FIGS. 12A to 12E.

In this specification, it is described that manufacturing steps of the pixel are sequentially performed according to the cross-sectional views. However, it will be apparent that each step of the cross-sectional views may be changed without departing from the scope of the disclosure. For example, some of the steps illustrated as being sequentially performed may be performed at the same time, the order of the steps may be changed, some steps may be omitted, or another step may be further included between the steps.

Figure 12A:
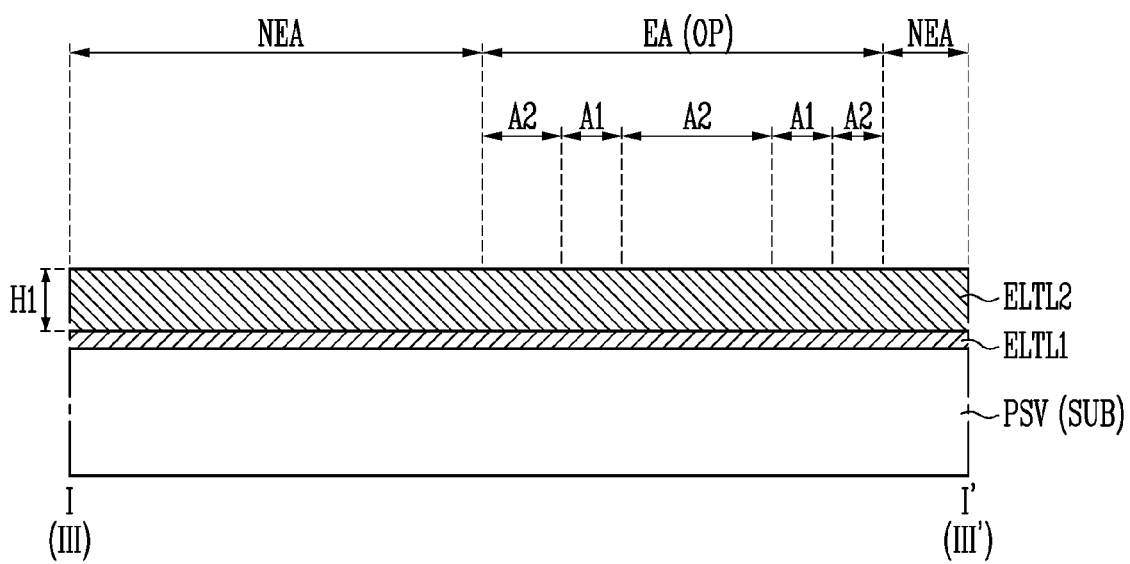
FIGS. 12A to 12E are cross-sectional views sequentially illustrating a manufacturing method of the pixel shown in FIG. 7A.

Referring to FIGS. 7A and 12A, a first electrode layer ELTL1 (or first conductive layer) and a second electrode layer ELTL2 (or second conductive layer) are sequentially formed on a protective layer PSV (or a substrate SUB). A thickness (e.g., a height H1) of the second electrode layer ELTL2 may be greater than that of the first electrode layer ELTL1, but the disclosure is not limited thereto.

Figure 12B:
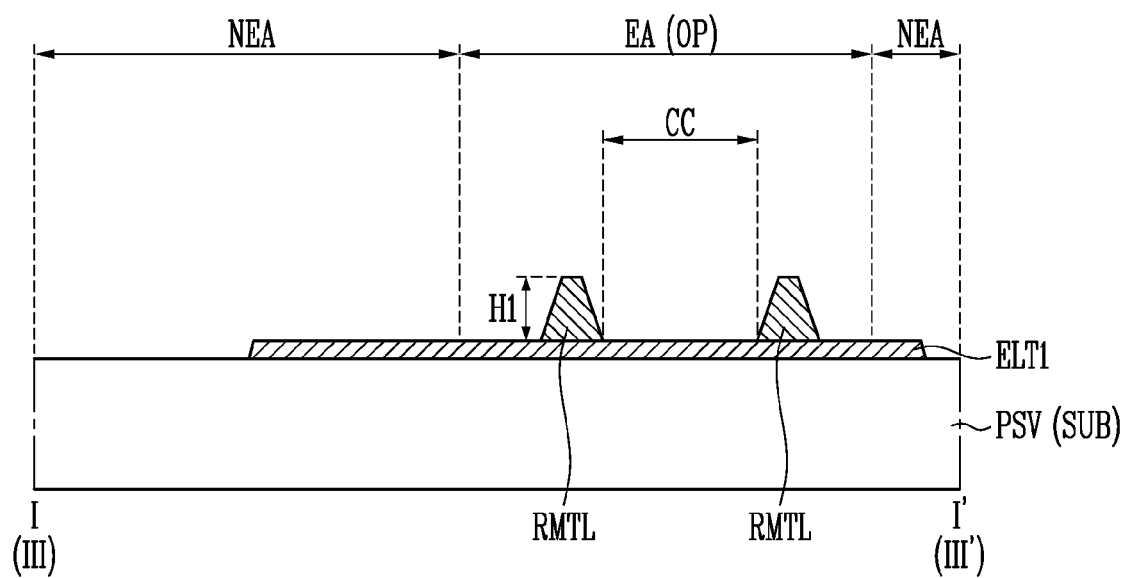

Subsequently, a first electrode ELT1 and a reflection pattern RMTL, which are shown in FIG. 12B, may be formed or patterned from the first electrode layer ELTL1 and the second electrode layer ELTL2 by using a halftone mask.

Referring to FIGS. 12A and 12B, an emission area EA may include first and second areas A1 and A2. The first area A1 may correspond to the reflection pattern RMTL, and the second area A2 may be the other area of the emission area EA except the first area A1. For example, the halftone mask may include a light transmitting part corresponding to a portion of a non-emission area NEA, a light blocking part corresponding to the first area A1 of the emission area EA, and a semi-transmitting part corresponding to the second area A2 of the emission area EA. The light transmitting part may allow light irradiated in exposure to be transmitted therethrough, the light blocking part may block the light, and the semi-transmitting part may block only a portion of the light. The first electrode ELT1 and the reflection pattern RMTL may be collectively formed by using a difference between amounts of beams of light transmitted through the light transmitting part, the light blocking part, and the semi-transmitting part. However, the disclosure is not limited thereto. The first electrode ELT1 may be formed by preliminarily etching the first electrode layer ELTL1 and the second electrode layer ELTL2 by using a first mask corresponding to the first electrode ELT1, and the reflection pattern RMTL may be formed by secondarily etching the second electrode layer ELTL2 by using a second mask corresponding to the reflection pattern RMTL.

In case that both the first electrode ELT1 and the reflection pattern RMTL are simultaneously formed by using a halftone mask, any additional process (or mask) for forming the reflection pattern RMTL may not be required. For example, the manufacturing process of the display panel DP (see FIG. 3) including the reflection pattern RMTL can be simplified.

According to the thickness, etching time, etc., of the reflection pattern RMTL, only a portion of the reflection pattern RMTL may be etched (see FIG. 8C), or the first electrode ELT1 may be further partially etched. For example, the first electrode ELT1 may not be exposed by the reflection pattern RMTL, or a portion of the first electrode ELT1 exposed by the reflection pattern RMTL may be further etched.

Figure 12C:
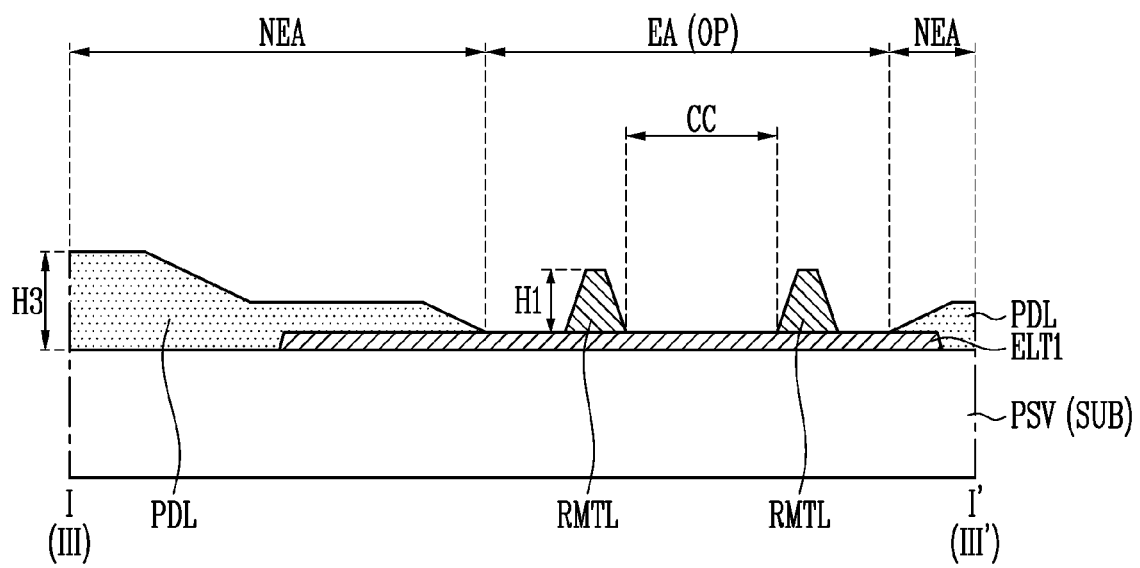

Subsequently, as shown in FIG. 12C, a pixel defining layer PDL may be disposed or formed on the protective layer PSV and the first electrode ELT1 in the non-emission area NEA. The pixel defining layer PDL may be spaced apart from the reflection pattern RMTL (or a side surface of the reflection pattern RMTL).

Figure 12D:
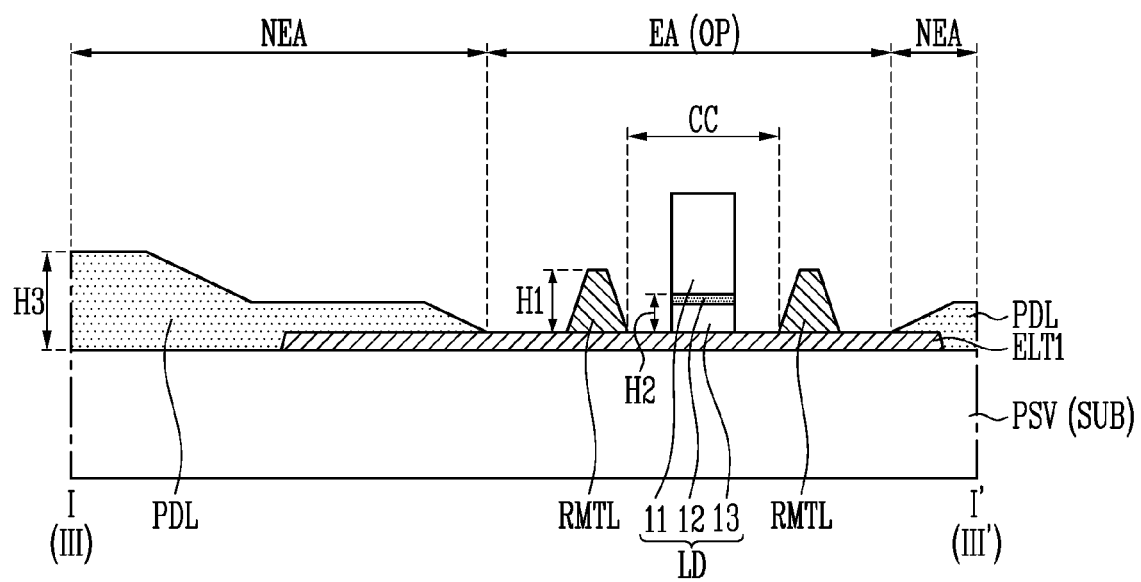

Subsequently, as shown in FIG. 12D, a light emitting element LD may be provided in a concave part CC of the emission area EA. For example, the light emitting element LD may be disposed in the concave part CC of the emission area EA by using a light emitting element array including light emitting elements arranged on a carrier substrate in the form of a checkerboard. Subsequently, the light emitting element LD may be bonded to the first electrode ELT1 by applying laser or heat to a second semiconductor layer 13 of the light emitting element LD or the first electrode ELT1 (or an area adjacent thereto). After the bonding of the light emitting element LD, the carrier substrate (and the light emitting element which is not bonded corresponding to the non-emission area NEA) may be removed.

Figure 12E:
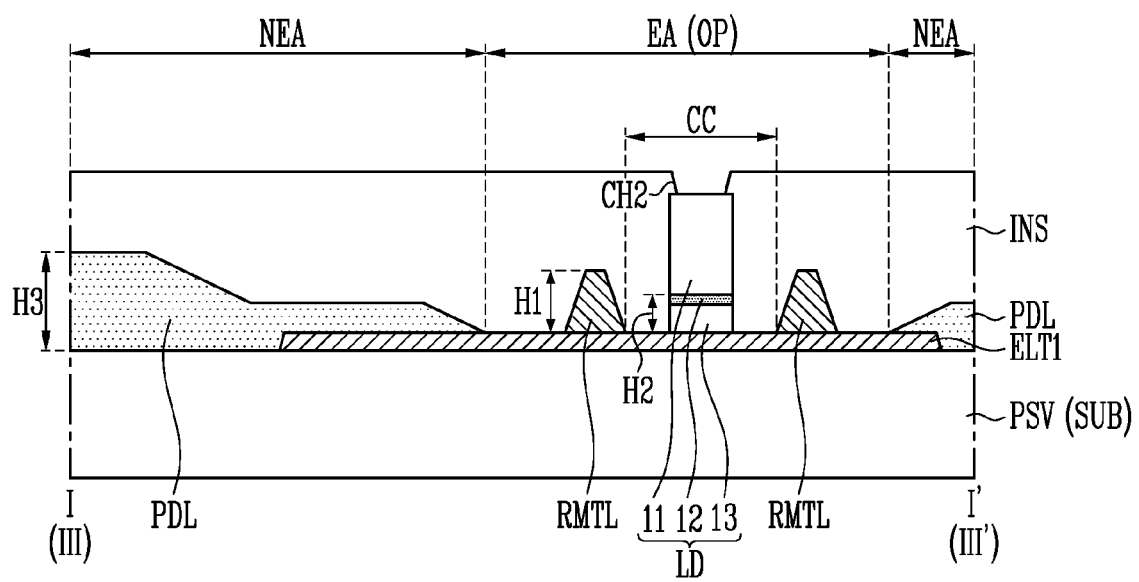

Subsequently, as shown in FIG. 12E, an insulating layer INS may be entirely formed on the substrate SUB to cover the pixel defining layer PDL, the first electrode ELT1, the reflection pattern RMTL, and the light emitting element LD. The insulating layer INS may fill an empty space between the pixel defining layer PDL and the reflection pattern RMTL and an empty space between the reflection pattern RMTL (or the side surface of the reflection pattern RMTL) and the light emitting element LD.

In some embodiments, a second contact hole CH2 exposing a first semiconductor layer 11 may be formed in the insulating layer INS.

Subsequently, as shown in FIG. 7A, a second electrode ELT2 may be formed on the insulating layer INS and the light emitting element LD. The second electrode ELT2 may be electrically connected to the first semiconductor layer 11 of the light emitting element LD through the second contact hole CH2.

As described above, the first electrode ELT1 and the reflection pattern RMTL may be collectively patterned by using a mask (e.g., a halftone mask). Thus, any additional process (or mask) for forming the reflection pattern RMTL is not required, and the manufacturing process of the display panel DP (see FIG. 3) including the reflection pattern RMTL can be simplified.

FIGS. 13 to 16 are schematic views illustrating examples of application of a display device in accordance with embodiments.

Figure 13:
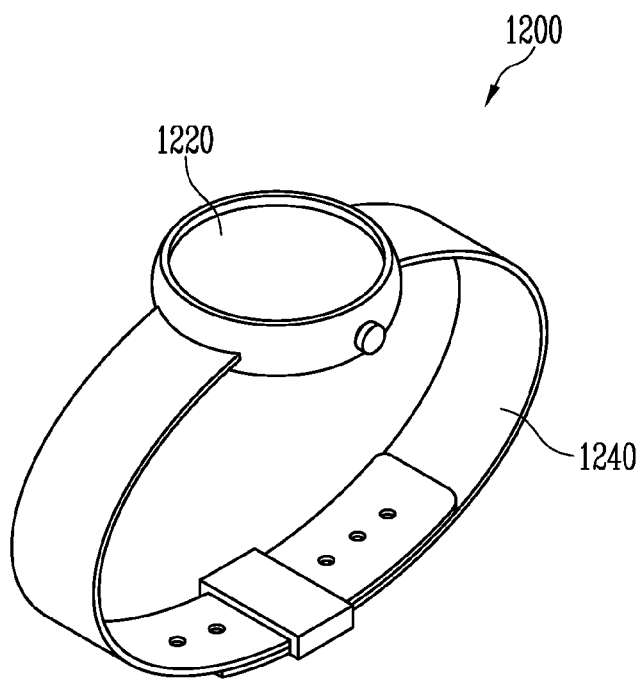
FIGS. 13 to 16 are views illustrating application examples of a display device in accordance with embodiments of the disclosure.

First, referring to FIGS. 1 and 13, the display device DD may be applied to a smartwatch 1200 including a display part 1220 and a strap part 1240.

The smartwatch 1200 is a wearable electronic device and may have a structure in which the strap part 1240 is mounted on a wrist of a user. The display device DD is applied to the display part 1220, so that image data including time information can be provided to the user.

Figure 14:
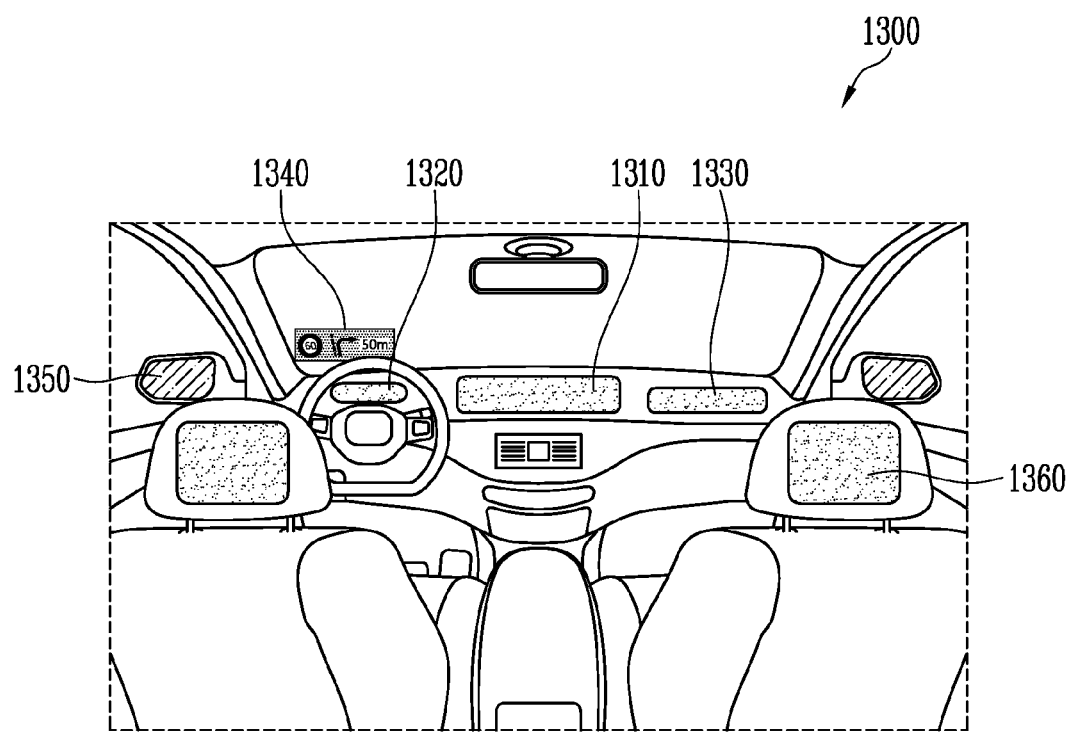

Referring to FIGS. 1 and 14, the display device DD may be applied to an automotive display 1300. The automotive display 1300 may mean an electronic device provided inside or outside of a vehicle to provide image data.

For example, the display device DD may be applied to at least one of an infortainment panel 1310, a cluster 1320, a co-driver display 1330, a head-up display 1340, a side-view mirror display 1350, and a rear-seat display 1360, which are provided in the vehicle.

Figure 15:
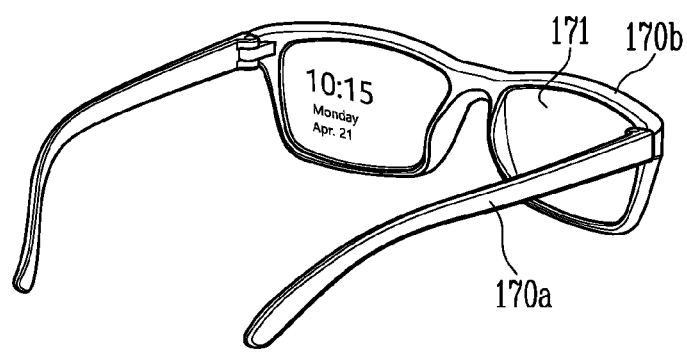

Referring to FIGS. 1 and 15, the display device DD may be applied to smart glasses including a frame 170 and a lens part 171. The smart glasses are a wearable electronic device which can be worn on the face of a user, and may have a structure in which a portion of the frame 170 is folded or unfolded. For example, the smart glasses may be a wearable device for augmented reality (AR).

The frame 170 may include a housing 170b supporting the lens part 171 and a leg part 170a for allowing the user to wear the smart glasses. The leg part 170a may be connected to the housing 170b by a hinge to be folded or unfolded.

A battery, a touchpad, a microphone, a camera, and the like may be built in the frame 170. A projector for outputting light, a processor for controlling a light signal, etc., may be built in the frame 170.

The lens part 171 may be an optical member which allows light to be transmitted therethrough or allows light to be reflected thereby. The lens part 171 may include glass, transparent synthetic resin, etc.

The lens part 171 may allow an image formed by a light signal transmitted from the projector of the frame 170 to be reflected by a rear surface (e.g., a surface in a direction facing eyes of the user) of the lens part 171, thereby enabling the eyes of the user to recognize the image. For example, as shown in the drawing, the user may recognize information including time, data, and the like, which are displayed on the lens part 171. For example, the lens part 171 is a kind of display device, and the display device DD may be applied to the lens part 171.

Figure 16:
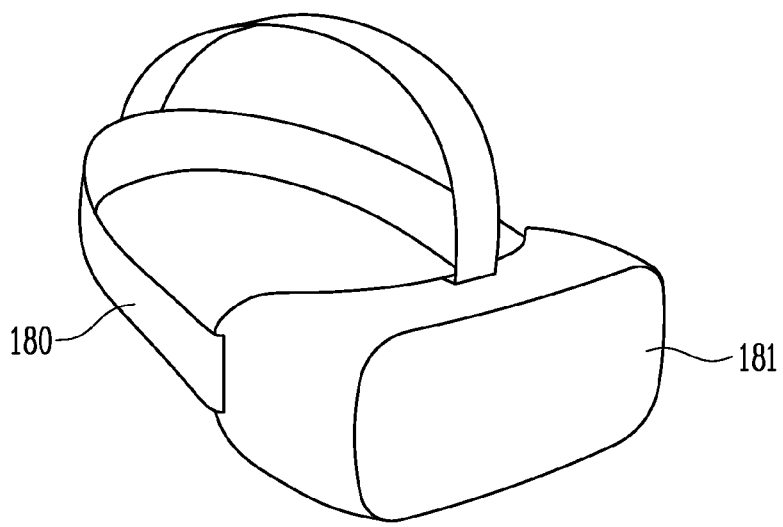

Referring to FIGS. 1 and 16, the display device DD may be applied to a head-mounted display (HMD) including a head-mounted band 180 and a display accommodating case 181. The HMD is a wearable electronic device which can be worn on the head of a user.

The head-mounted band 180 is a part extended to the display accommodating case 181 to fix the display accommodating case 181. In the drawing, it is illustrated that the head-mounted band 180 can surround a top surface and both side surfaces of the head of the user. However, the disclosure is not limited thereto. The head-mounted band 180 is used to fix the HMD to the head of the user, and may be formed in the shape of a glasses frame or a helmet.

The display accommodating case 181 accommodates the display device DD and may include at least one lens. The at least one lens is a part which provides an image to the user. For example, the display device DD may be applied to a left-eye lens and a right-eye lens, which are implemented in the display accommodating case 181.

In accordance with the disclosure, the display device includes a reflection pattern protruding in an upper direction from a first electrode in an emission area to form a concave part on the first electrode, and a light emitting element is disposed in a concave part. The reflection pattern reflects light emitted from the light emitting element in an image display direction. Thus, light interference between adjacent pixels is prevented, so that an image can be displayed with a more accurate luminance. Accordingly, the light emission efficiency of the display device can be improved.

Further, the reflection pattern is directly formed on the first electrode before a pixel defining layer is formed, or is collectively formed with the first electrode by using a process (or a mask for exposure), and thus an additional process for forming the reflection pattern can be omitted. For example, the manufacturing process of the display device including the reflection pattern can be simplified, and manufacturing cost can be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure.

What is claimed is:

1. A display device comprising:
a first electrode disposed on a substrate;

a pixel defining layer disposed on the substrate in a non-emission area, the pixel defining layer overlapping at least a portion of an edge of the first electrode in a plan view, the pixel defining layer defining an emission area;

a reflection pattern protruding upward from the first electrode in the emission area and forming a concave part on the first electrode;

a light emitting element disposed in the concave part and electrically connected to the first electrode;

and a second electrode disposed on the light emitting element and electrically connected to the light emitting element, wherein the reflection pattern does not overlap the pixel defining layer in the plan view.

2. The display device of claim 1, wherein the reflection pattern is spaced apart from the pixel defining layer.

3. The display device of claim 1, wherein the reflection pattern includes a metal which reflects light emitted from the light emitting element.

4. The display device of claim 1, further comprising:

an insulating layer disposed between the reflection pattern and the second electrode, wherein a side surface of the reflection pattern, which corresponds to the concave part, is spaced apart from the light emitting element, and the insulating layer is disposed in a space between the side surface of the reflection pattern and the light emitting element and a space between the reflection pattern and the pixel defining layer.

5. The display device of claim 1, wherein the light emitting element includes:

a second semiconductor layer electrically connected to the first electrode;

a first semiconductor layer electrically connected to the second electrode; and an active layer disposed between the second semiconductor layer and the first semiconductor layer, and with respect to the first electrode, a height of a top surface of the reflection pattern is greater than a height of the active layer.

6. The display device of claim 5, wherein a thickness of the reflection pattern is smaller than a thickness of the light emitting element.

7. The display device of claim 1, wherein with respect to the substrate, an inclined angle of a side surface of the reflection pattern, which corresponds to the concave part, is different from an inclined angle of a side surface of the pixel defining layer.

8. The display device of claim 1, wherein the concave part is defined by the reflection pattern on a plane, and has a circular, quadrangular, or polygonal planar shape.

9. The display device of claim 1, wherein a portion of the concave part is defined by the pixel defining layer on a plane.

10. The display device of claim 1, wherein the first electrode includes a material having an electrical conductivity higher than an electrical conductivity of the reflection pattern.

11. The display device of claim 10, wherein the reflection pattern includes an opening exposing the first electrode, and the concave part is defined by the opening of the reflection pattern and the first electrode.

12. The display device of claim 10, wherein the reflection pattern includes:

a first part completely overlapping the first electrode on a plane; and a second part protruding upward from the first part, and the light emitting element is disposed on the first part of the reflection pattern.

13. The display device of claim 1, wherein the reflection pattern is integral with the first electrode.

14. The display device of claim 1, further comprising:

a light conversion pattern located on the light emitting element and corresponding to the emission area; and a light blocking pattern located on the pixel defining layer and corresponding to the non-emission area.

15. The display device of claim 14, wherein the light conversion pattern includes:

a color conversion layer converting light of a first color, which is emitted from the light emitting element, into light of a second color; and a color filter located on the color conversion layer, the color filter allowing the light of the second color to be selectively transmitted therethrough.

16. The display device of claim 1, further comprising:

a sensor electrode disposed on the second electrode in the non-emission area;

a first refractive layer overlapping the sensor electrode, the first refractive layer including an opening corresponding to the emission area; and a second refractive layer disposed on the first refractive layer and disposed in the opening of the first refractive layer.

* * * * *